(12) United States Patent
Fujikata et al.

(10) Patent No.: US 7,800,193 B2
(45) Date of Patent: Sep. 21, 2010

(54) PHOTODIODE, METHOD FOR MANUFACTURING SUCH PHOTODIODE, OPTICAL COMMUNICATION DEVICE AND OPTICAL INTERCONNECTION MODULE

(75) Inventors: Junichi Fujikata, Tokyo (JP); Keishi Ohashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 12/282,959

(22) PCT Filed: Mar. 8, 2007

(86) PCT No.: PCT/JP2007/054545

§ 371 (c)(1),
(2), (4) Date: Sep. 15, 2008

(87) PCT Pub. No.: WO2007/105593

PCT Pub. Date: Sep. 20, 2007

(65) Prior Publication Data

US 2009/0134486 A1    May 28, 2009

(30) Foreign Application Priority Data

Mar. 13, 2006  (JP) .............................. 2006-067594

(51) Int. Cl.
    *H01L 31/108* (2006.01)
(52) U.S. Cl. ................. 257/449; 257/E31.093
(58) Field of Classification Search ................. 257/449, 257/450, 451, 448, E31.093
    See application file for complete search history.

(56) References Cited

U.S. PATENT DOCUMENTS 5,559,359 A * 9/1996 Reyes .......................... 257/453
5,739,561 A * 4/1998 Wennekers .................. 257/257
6,809,352 B2 * 10/2004 Nishii et al. ................. 257/192
6,846,731 B2 * 1/2005 Lu et al. ...................... 438/570
7,061,067 B2 * 6/2006 Tanaka et al. ............... 257/484
7,250,666 B2 * 7/2007 Nowak ........................ 257/471
2003/0185135 A1 * 10/2003 Fujikata et al. ........ 369/112.21

FOREIGN PATENT DOCUMENTS

| JP | 59-108376  | 6/1984  |
| JP | 60-262473  | 12/1985 |
| JP | 62-205667  | 9/1987  |
| JP | 2-214170   | 8/1990  |
| JP | 4-40176    | 1/1992  |

(Continued)

OTHER PUBLICATIONS

S.J. Koester et al., "Germanium-onInsulator Photodetectors", 0-7803-9070-p. 171-173.
Tineke Thio et al., "Giant Optical Transmission of Sub-Wavelenght Apertures: Pysics and Applications", PII: S0957-4484(02)31503-4, p. 429-432.

*Primary Examiner*—Nathan W Ha
(74) *Attorney, Agent, or Firm*—Young & Thompson

(57) ABSTRACT

Both high light receiving sensitivity and high speed of a photodiode are achieved at the same time. The photodiode is provided with a semiconductor layer (1) and a pair of metal electrodes (2) which are arranged on the surface of the semiconductor layer (1) at an interval (d) and form an MSM junction. The interval (d) satisfies the relationship of $\lambda > d > \lambda/100$, where $\lambda$ is the wavelength of incident light. The metal electrodes (2) can induce surface plasmon. At least one of the electrodes forms a Schottky junction with the semiconductor layer (1), and a low end portion is embedded in the semiconductor layer (1) to a position at a depth less than $\lambda/2n$, where n is the refractive index of the semiconductor layer (1).

44 Claims, 15 Drawing Sheets

FOREIGN PATENT DOCUMENTS

| | | |
|---|---|---|
| JP | 7-153989 | 6/1995 |
| JP | 2666888 | 6/1997 |
| JP | 270757 | 10/1997 |
| JP | 10-509806 | 9/1998 |
| JP | 2000-171763 | 6/2000 |
| JP | 2001-326420 | 11/2001 |
| JP | 2002-76410 | 3/2002 |
| JP | 2002-368253 | 12/2002 |
| JP | 2003-520438 | 7/2003 |
| JP | 2003-287656 | 10/2003 |
| JP | 2004-109965 | 4/2004 |
| JP | 2005-150291 | 6/2005 |
| JP | 2006-40347 | 2/2006 |
| WO | WO 2005/098966 | 10/2005 |

\* cited by examiner

[Fig.1]
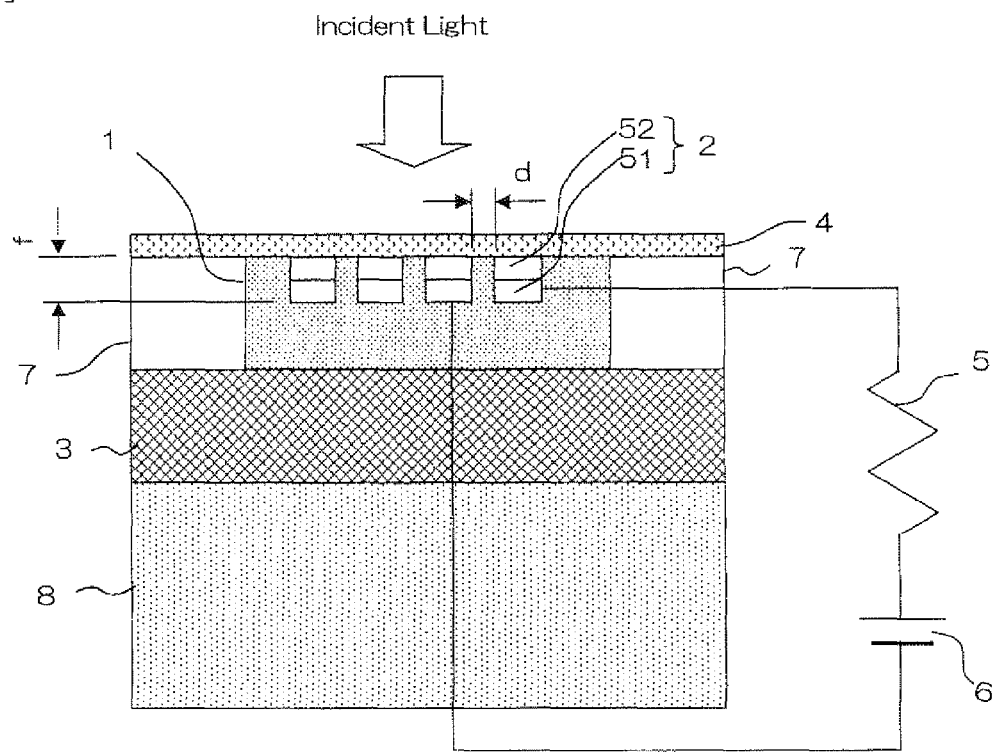
[Fig.2]
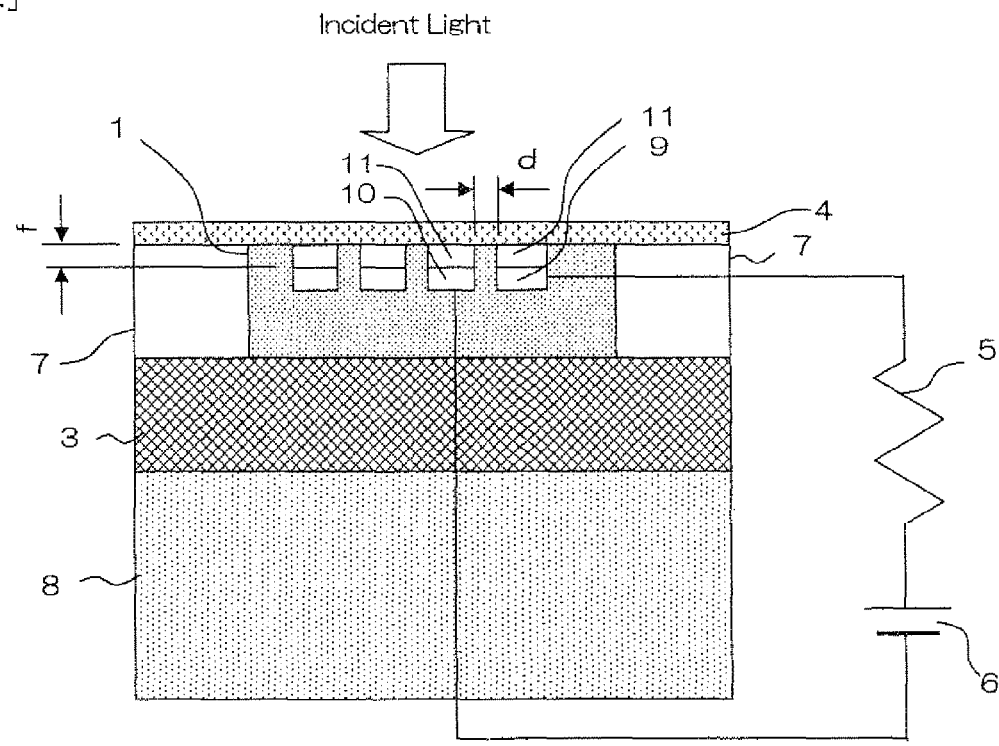

[Fig.3]
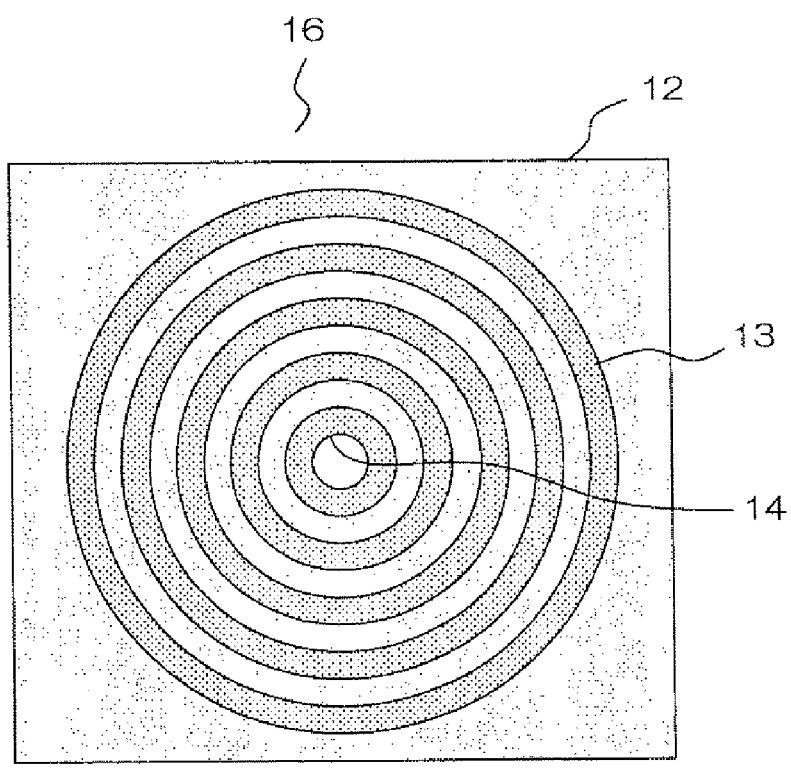
[Fig.4]
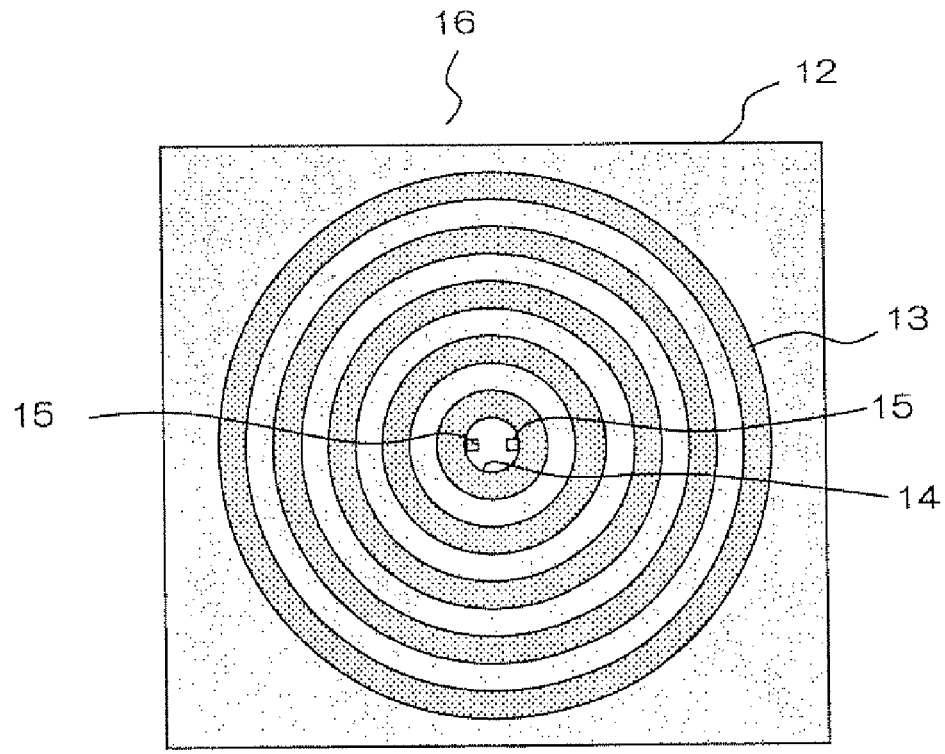

[Fig.5]
(a)
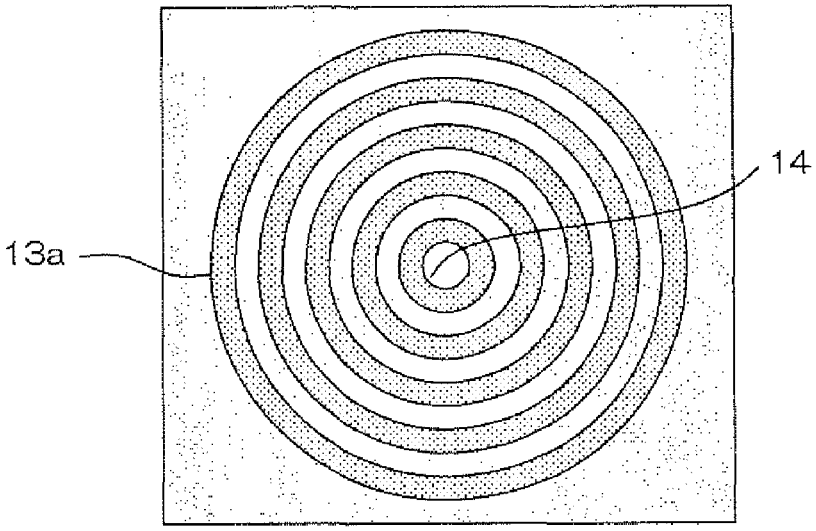
(b)
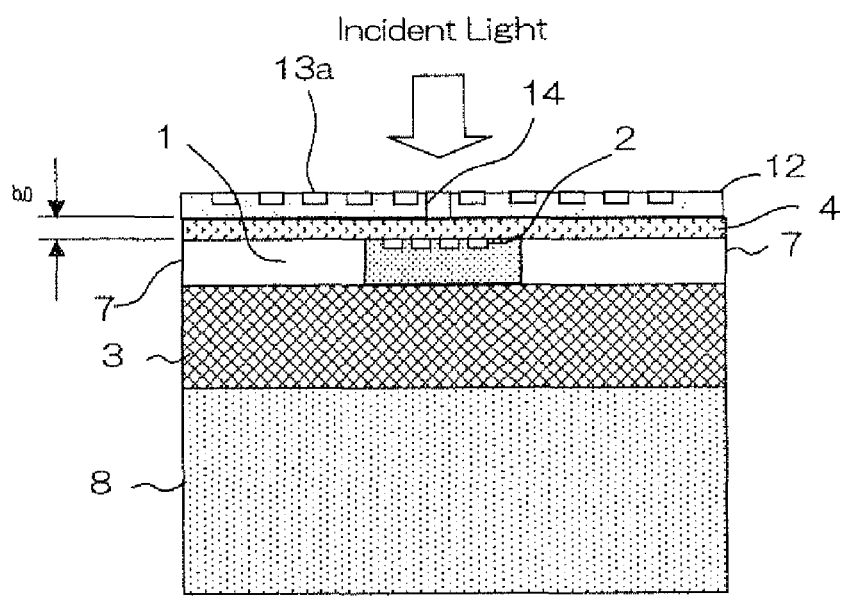

[Fig.6]
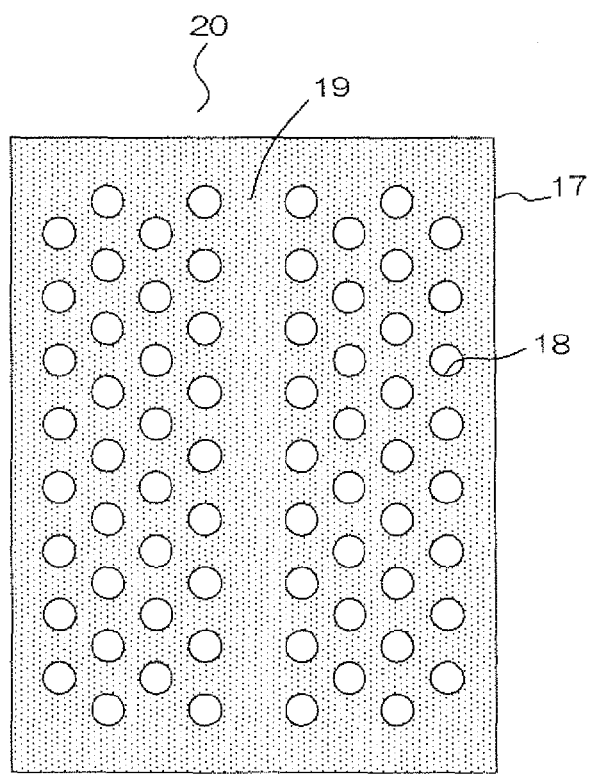
[Fig.7]
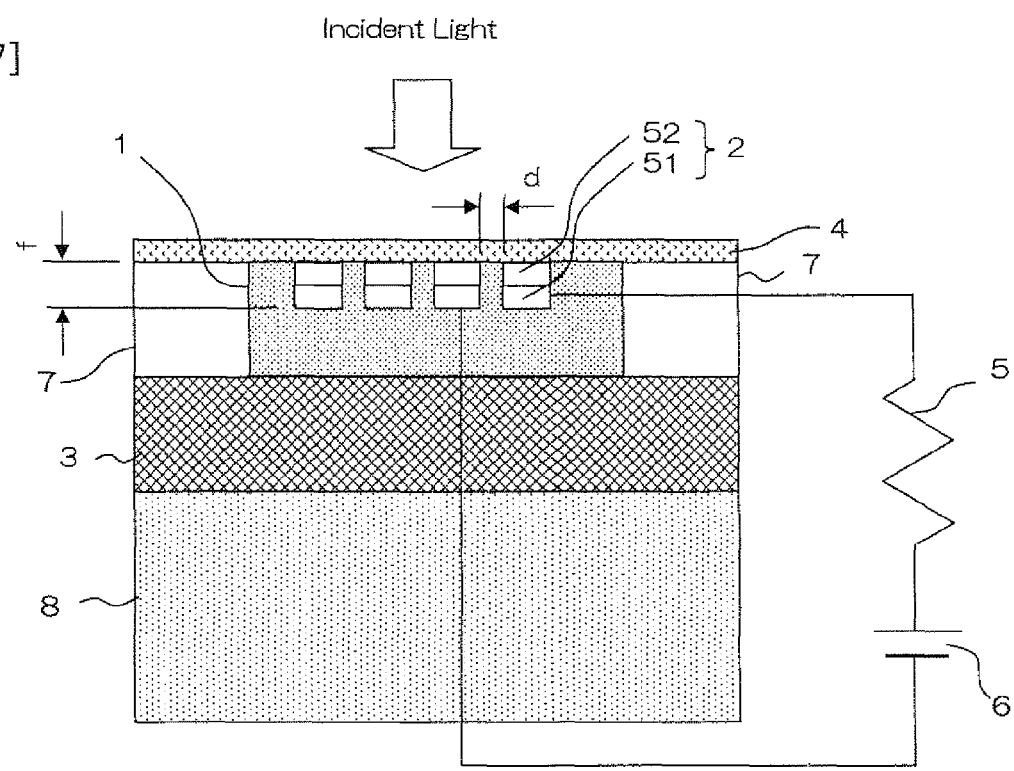

[Fig.8]
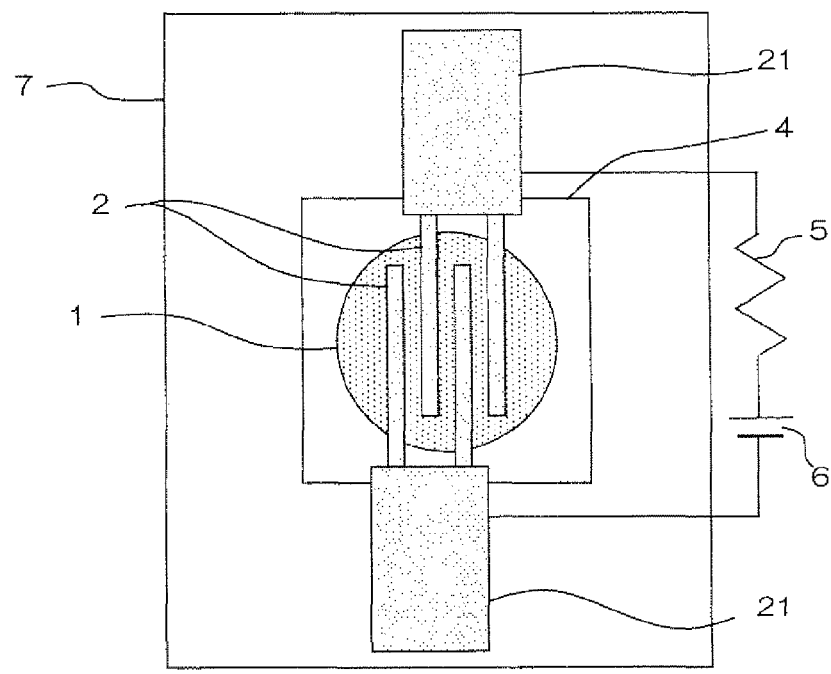
[Fig.9]
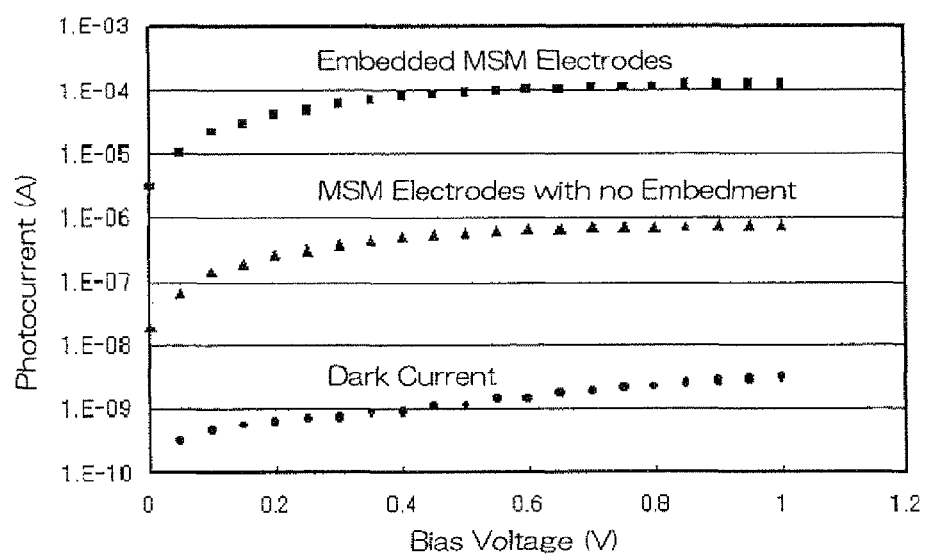

[Fig.10]
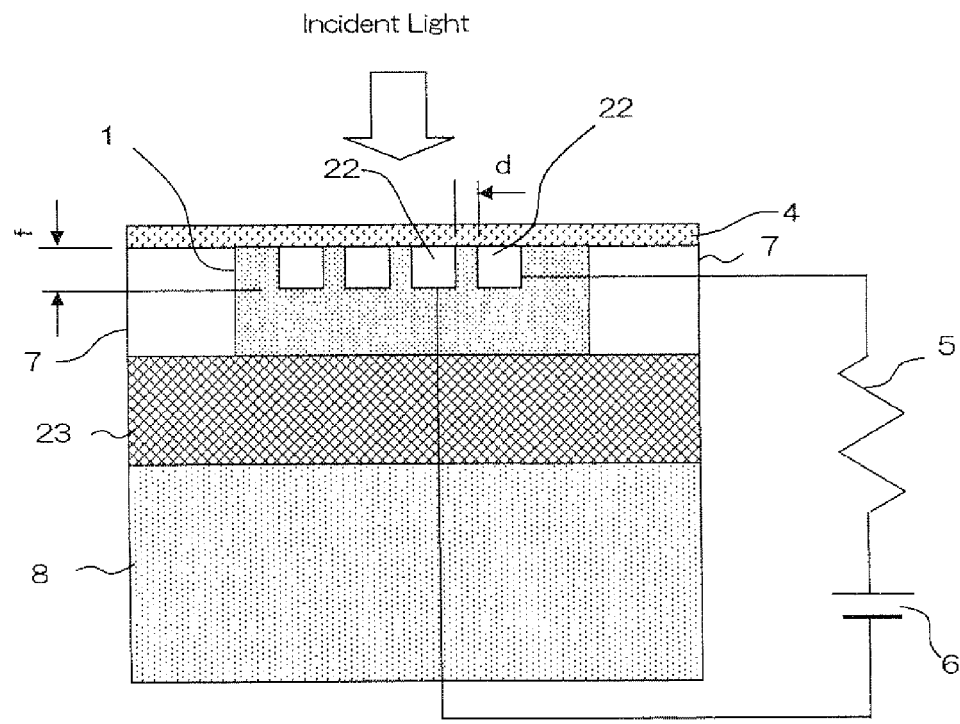
[Fig.11]
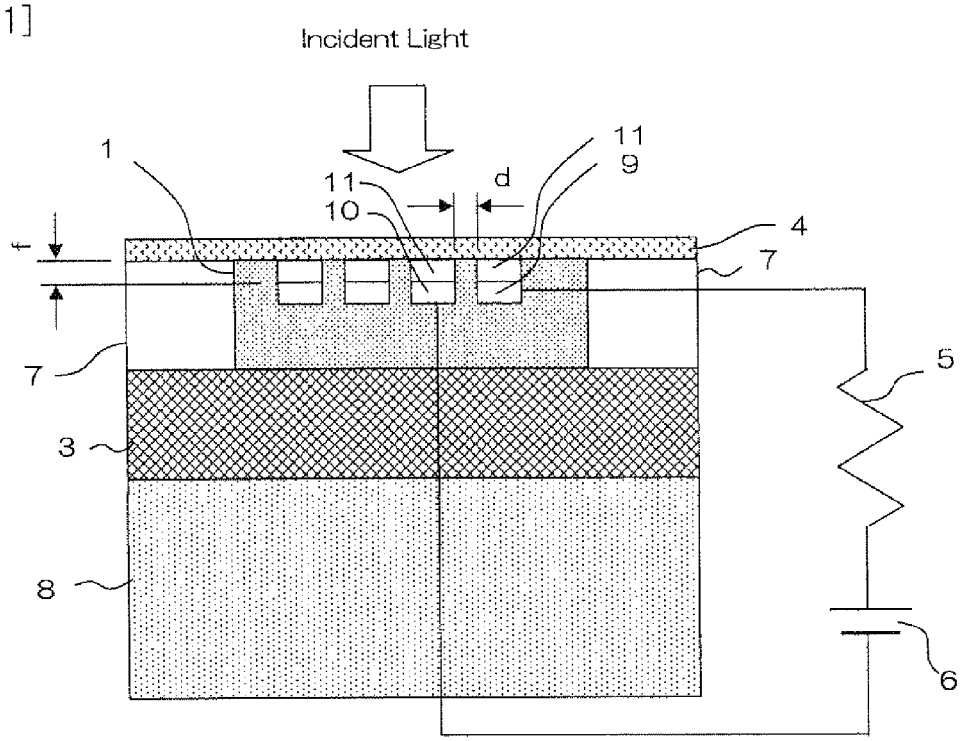

[Fig.12]
(a)
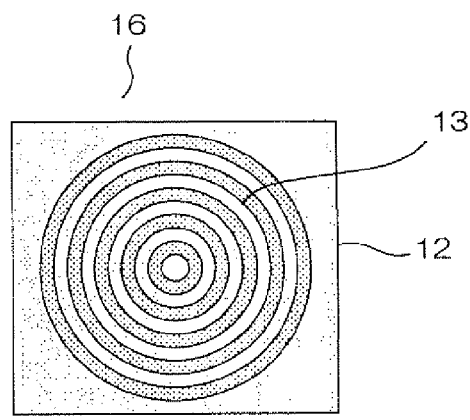
(b)
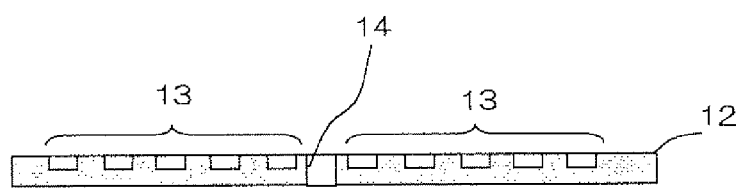
[Fig.13]
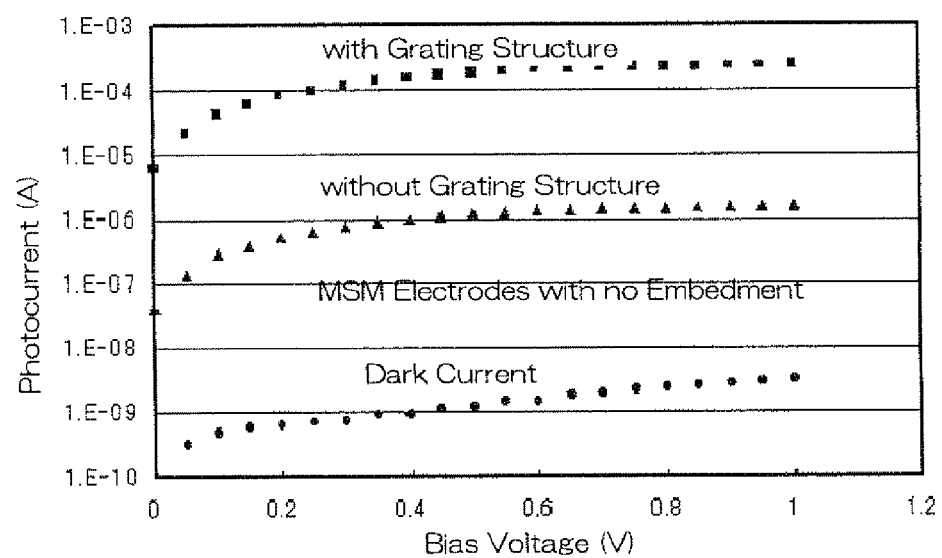

[Fig.14]
(a)
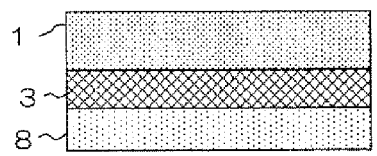
(f)
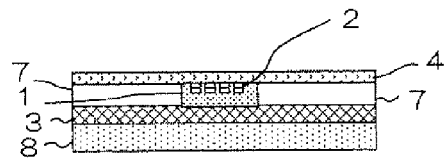
(b)
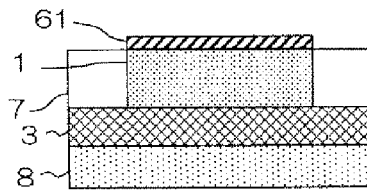
(g)
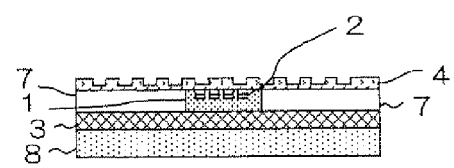
(c)
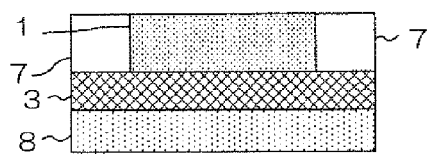
(h)
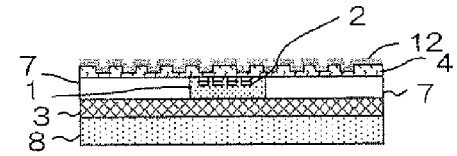
(d)
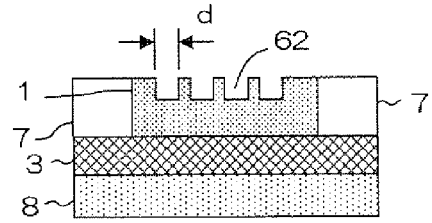
(i)
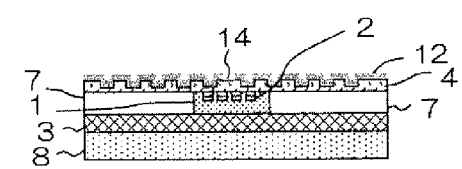
(e)
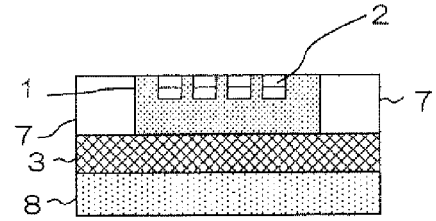

[Fig.15]
(a)
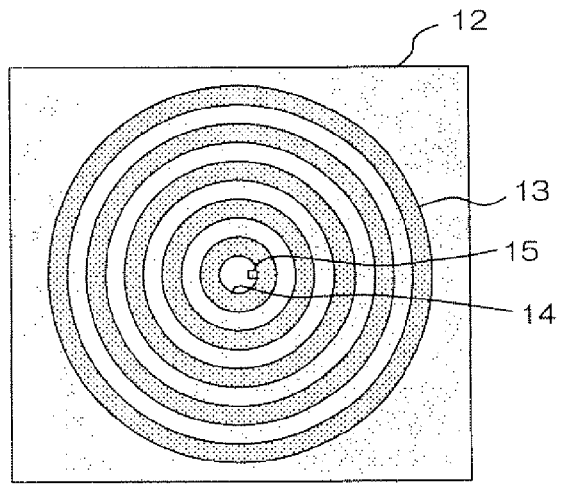
(b)
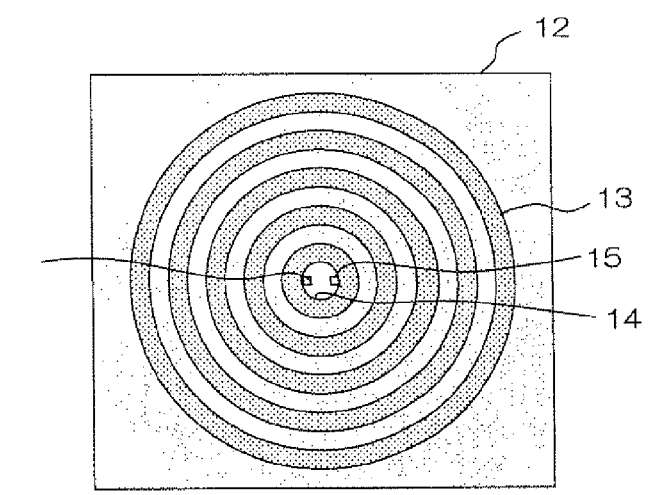
(c)
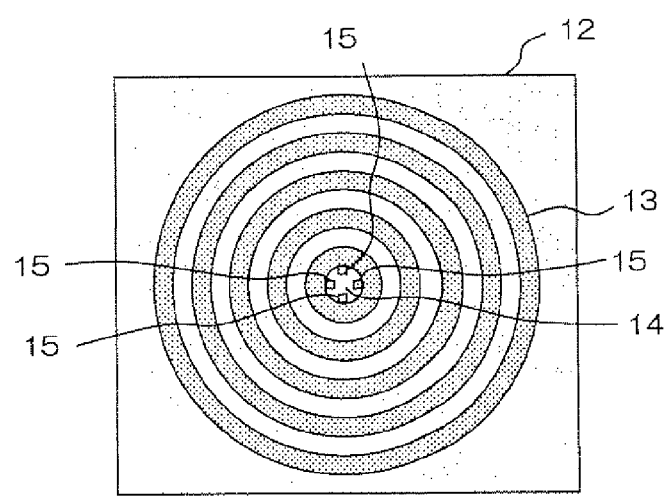

[Fig.16]
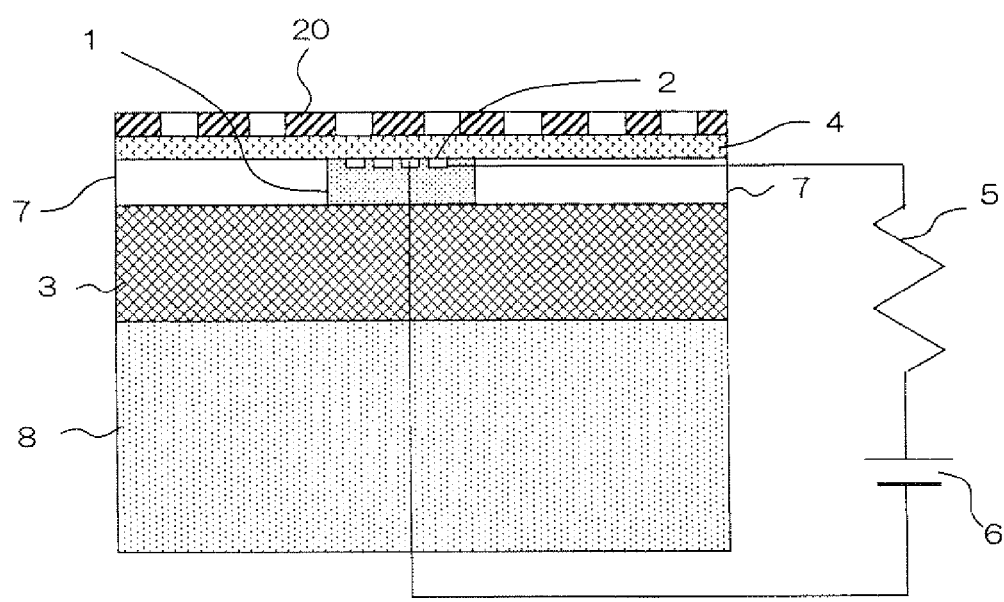

[Fig.17]
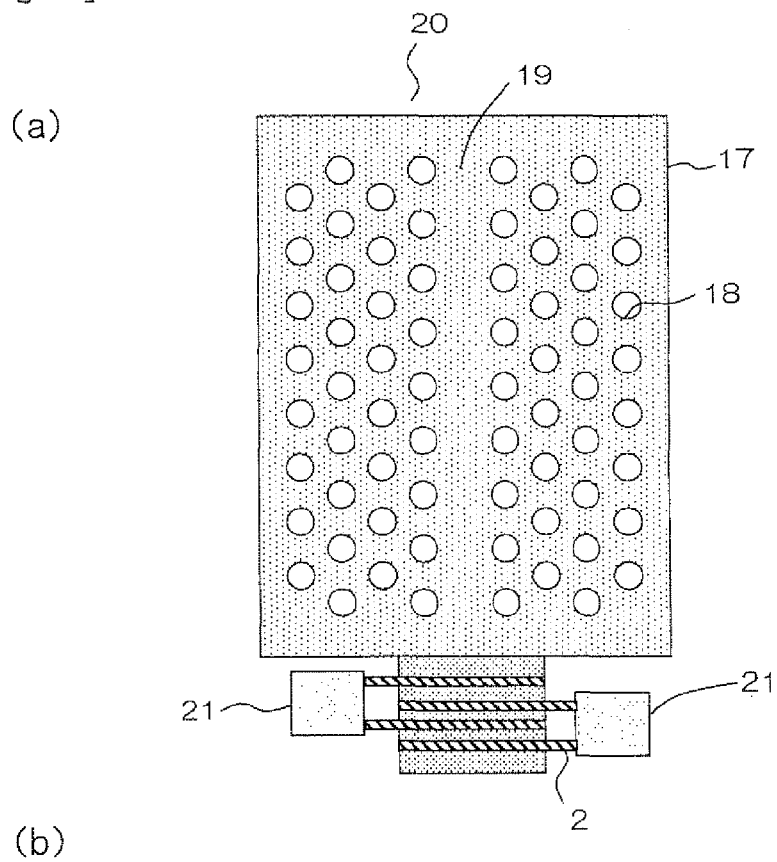

[Fig.18]
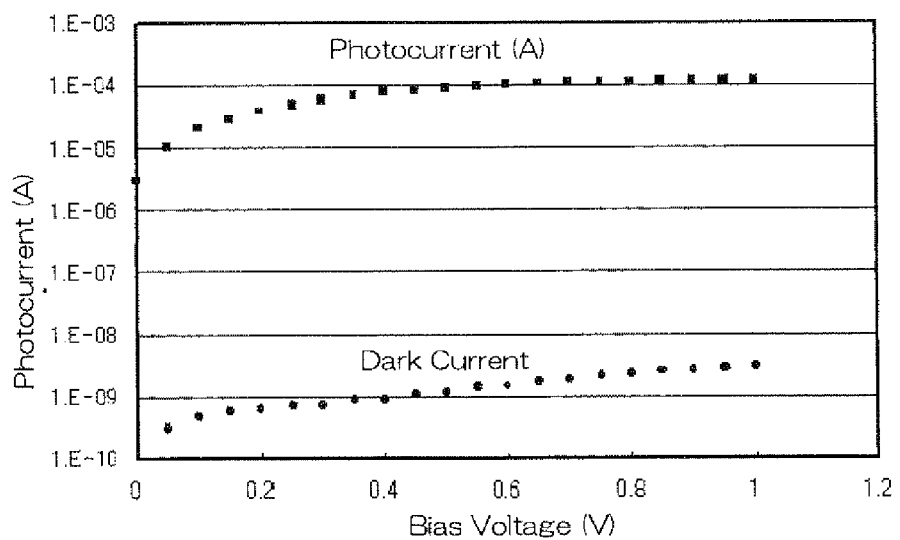
[Fig.19]
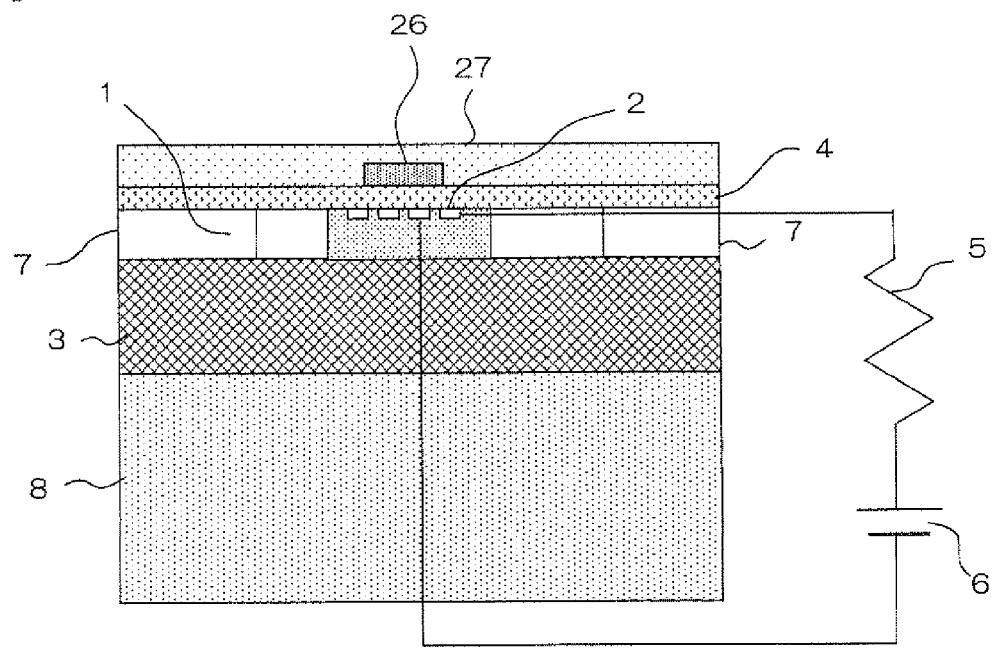

[Fig.20]
(a)
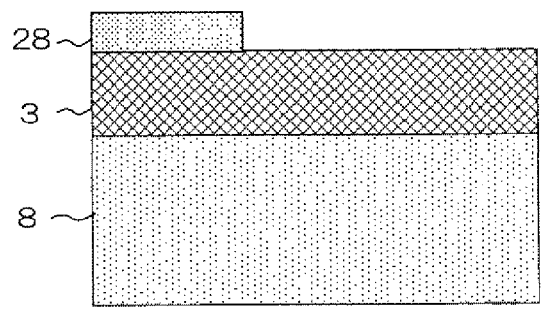
(b)
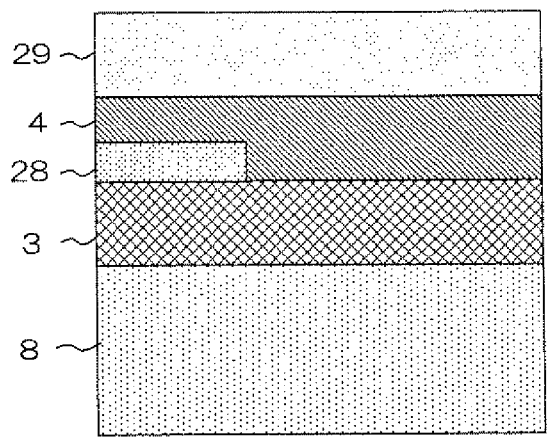
(c)
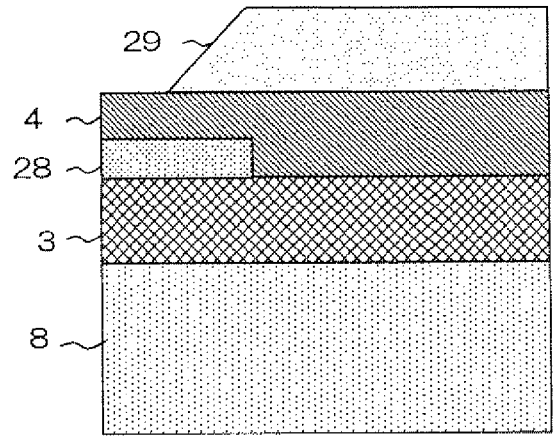

[Fig.21]
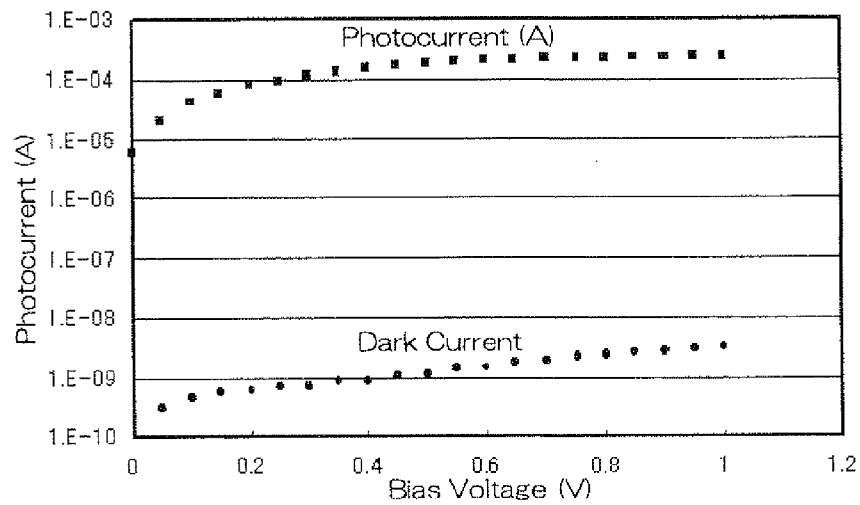
[Fig.22]
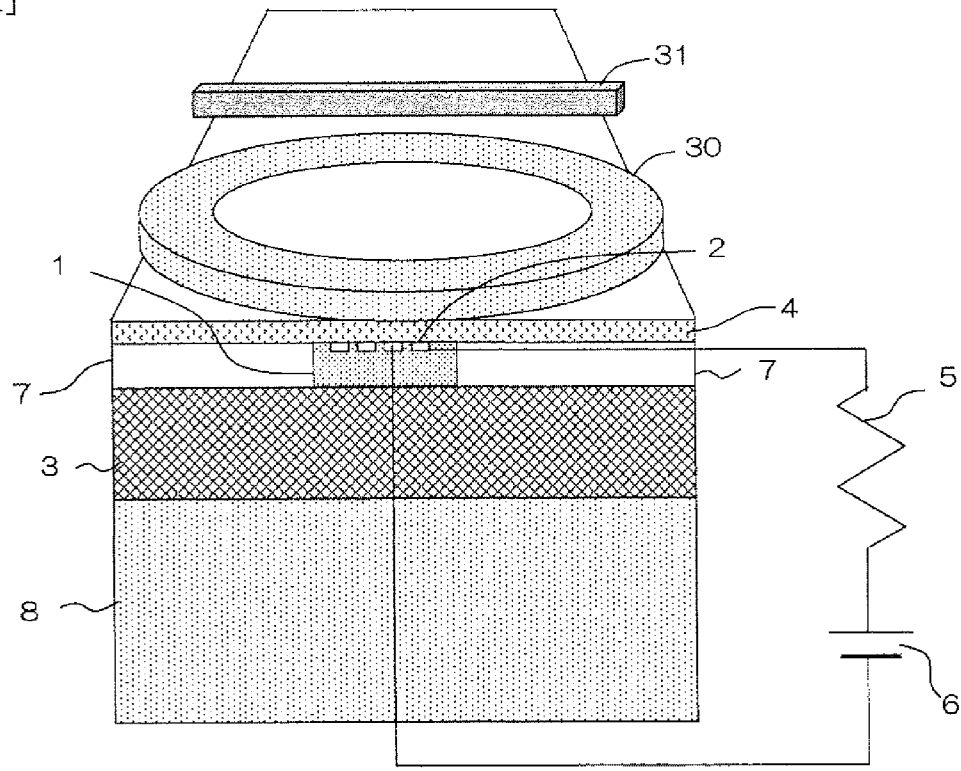

[Fig.23]
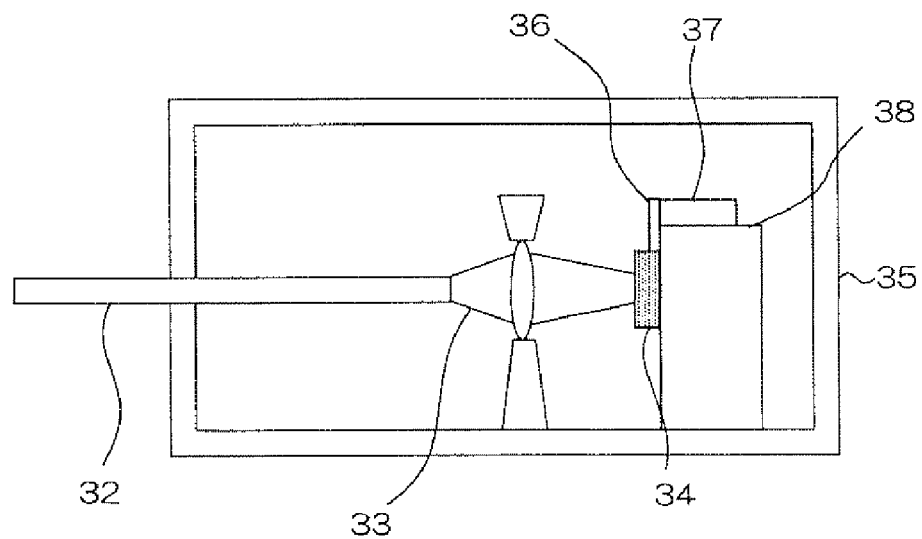
[Fig.24]
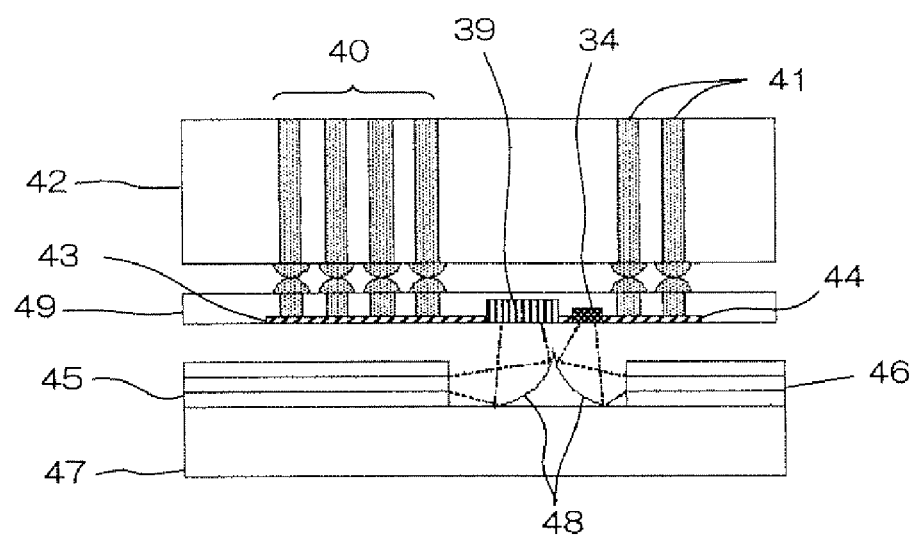

PHOTODIODE, METHOD FOR MANUFACTURING SUCH PHOTODIODE, OPTICAL COMMUNICATION DEVICE AND OPTICAL INTERCONNECTION MODULE

TECHNICAL FIELD

The present invention relates to a photodiode required in the fields of information processing and communication for converting a light signal that includes infrared rays to an electric signal at high speed.

BACKGROUND ART

Monolithic integration of an optical detector using silicon electronic technique is quite attractive from the viewpoint of cost and yield. A monolithically integrated silicon photodetector integrated on a chip together with a CMOS circuit, i.e., a silicon photodiode, is an attractive alternative for a hybrid photodetector, such as an InGaAs photodiode connected to a CMOS circuit or to a GaAs circuit.

A monolithically integrated photodetector can be manufactured using a common silicon process and is expected to be manufactured at lower cost than a hybrid design.

Photodiodes are often used as a means for converting an optical signal to an electric signal at high speed. One typical example thereof is a pin-type photodiode. The pin-type photodiode has a structure in which an i layer of an intrinsic semiconductor is interposed between a p layer of a p-type semiconductor and an n layer of a n-type semiconductor. When a reverse bias voltage is applied to the photodiode from a bias power supply, substantially the entire region of the high resistant i layer becomes a depletion layer devoid of charge carriers. Photons of incident light are mainly absorbed by the i layer and produce electron/hole pairs. The electrons and holes that have been produced drift through the depletion layer in directions opposite to each other under the reverse bias voltage, producing an electric current, and the current is then detected as a signal voltage by a load resistor. Main factors that limit response speed of the photoelectric conversion include a time constant of the circuit, which is defined as the product of the load resistance and electric capacitance created by the depletion layer, and carrier running time required for electrons and holes to pass through the depletion layer.

One type of photodiodes having short carrier running time is the Schottky type photodiode. The Schottky type photodiode has a structure in which a translucent metal film is in contact with an n layer or an n-layer of a semiconductor. A Schottky barrier is formed near the interface on which the n layer or the n-layer and the translucent metal film are in contact with each other. The area near the Schottky barrier becomes a depletion layer because electrons scatter from the translucent metal film into the n layer or the n-layer. When incident light is radiated in this state, electrons are generated in the n layer or in the n-layer and drift through the depletion layer under the reverse bias voltage. Furthermore, the Schottky type photodiode can effectively use optical absorption on the element surface layer. While the pin-type photodiode requires a sufficient thickness of the i layer or the depletion layer in order to absorb photons the Schottky photodiode requires a thinner depletion layer, and thereby provides a reduction in carrier running time. Furthermore, studies have been made about a lateral electrode structure in order to reduce the thickness of the depletion layer of a pin-type photodiode and thereby to reduce a gap between electrodes, as described in Non-Patent Document 1. However, it is difficult for this structure to achieve high sensitivity because of the poor optical absorption efficiency on the surface layer of semiconductor, although it provides an enhanced response.

On the other hand, reducing the value of load resistance to shorten the time constant of the circuit causes a decrease in the voltage of a reproduced signal that is detected. Therefore, reducing the electric capacitance of the depletion layer is necessary to improve the SN ratio of a reproduced signal and to reduce read errors. Especially, since reducing the thickness of the depletion layer to shorten the carrier running time causes an increase in electric capacitance, it is necessary to reduce the area of the depletion layer or the Schottky junction in order to enhance response. However, reducing the junction area is problematic because it causes a reduction in utilization efficiency of signal light, which results in degradation of the SN ratio of the reproduced signal.

To cope with these problems, various attempts have been made along with the recent development of technology that aim at achieving high-speed response and downsizing of photoelectric conversion devices of this type, compared to conventional devices, by using metal surface plasmons or a photonic crystalline structure.

For example, Patent Document 1 describes an optical detector that uses a metal/semiconductor/metal (MSM) device having two electrodes disposed on one surface of semiconductor. The MSM-type optical detector is a kind of Schottky photodiode that generally has a Schottky barrier near the two electrodes. Light which passes through the electrode surface is partially absorbed in the semiconductor layer, producing photocarriers. The MSM-type optical detector is disadvantageous in that increasing the thickness of a semiconductor for the purpose of increasing quantum efficiency causes an increase in the propagation distance of photocarriers and resultantly causes a slow response. To prevent the slow response, the optical detector described in Patent Document 1 has metal electrodes that are disposed along periodically arranged convex and concave parts. Incident light can be efficiently coupled with surface plasmon of the metal electrodes and can propagate into the optical detector.

Patent Document 2 describes a method for manufacturing an MSM-type light receiving element by forming a metal film on a semiconductor, and by oxidizing part of the metal film to form a light transmitting insulator pattern.

Patent Document 3 describes enhancing the response of an MSM-type light receiving element by reducing the width of a light transmitting insulator pattern to the wavelength or less in order to utilize an optical near field that is generated from both ends of a metal film located on both sides of the light transmitting insulator pattern.

Patent Document 4 describes a photoelectron coupler in which positive electrodes and negative electrodes are arranged on a semiconductor at a regular interval such that the positive and negative electrodes are nested in each other. This document describes a technique for coupling incident light, transmitted light, reflected light and surface plasmon polariton etc. with each other, through resonance, by using such a device structure. This document describes that a MSM-type light receiving element disclosed herein that uses a photoelectron coupler technique enables intensification of photocarriers generated by incident light by coupling between incident light and surface plasmon. However, these light receiving elements are problematic because reducing the radiation area of incident light in order to reduce the electric capacitance of the depletion layer leads to a reduction in the intensity of the detected signal and deterioration of the SN ratio.

Patent Document 5 describes a photovoltaic device that uses solar energy. In this photovoltaic device, one of two electrodes that interpose a plurality of spherical semiconductors having a pn junction is provided with periodically arranged openings or concave parts. The device uses resonance between surface plasmon on the electrodes having a periodic pattern and incident light. However, this technique does not describe reducing the thickness and the area of a depletion layer in order to enhance response of photoelectric conversion.

Furthermore, Patent Document 6 describes an optical transmission apparatus that is capable of intensifying propagating light by disposing a periodic groove array around an opening compared to a case having no periodic groove array, even if only a single opening is provided. However, it is known that the total energy of transmitted light is attenuated compared to the energy of incident light. According to a document (Tineke Thio, H. J. Lezec, T. W. Ebbesen, K. M. Pellerin, G. D. Lewen, A. Nahata, R. A. Linke, "Giant optical transmission of sub-wavelength apertures: physics and applications," Nanotechnology, vol. 13, pp. 429-432, FIG. 4), the total energy of light that is transmitted through an opening having a diameter of 40% or less of the wavelength is attenuated to 1% or less of incident light energy. Therefore, a high SN ratio can not be obtained even if propagating light from this optical transmission apparatus is radiated onto a light receiving element.

Furthermore, Patent Document 7 describes an MSM light receiving element structure that has a light absorbing layer having a multilayered structure to form a photonic band. The physical absorption thickness is reduced by decreasing the group velocity of light that is absorbed and transmitted, and thereby light receiving efficiency is increased. However, this structure does not realize a reduction in the junction area of the MSM junction and a resultant reduction in the element capacitance.

Non-Patent Document 1: S. J. KOESTER, G. Dehlinger, J. D. Schaub, J. O. Chu, Q. C. Ouyang, and A. Grill, "Germanium-on-Insulator Photodetectors", 2nd International Conference on Group 4 Photonics, FB1 2005, (p. 172, FIG. 3)

Patent Document 1: Japanese Patent Application Laid-Open No. 108376/84 (p 4-16, FIGS. 1-3)

Patent Document 2: Japanese Patent No. 2666888 (p 3-4, FIG. 2)

Patent Document 3: Japanese Patent No. 2705757 (p 6, FIG. 1)

Patent Document 4: Japanese Patent Application Laid-Open No. 509806/98 (p 26-33, FIG. 1)

Patent Document 5: Japanese Patent Application Laid-Open No. 2002-76410 (p 6-9, FIG. 1)

Patent Document 6: Japanese Patent Application Laid-Open No. 2000-171763 (p 7-10, FIG. 10, FIG. 17)

Patent Document 7: Japanese Patent Application Laid-Open No. 2005-150291 (p 5, FIG. 1)

The MSM photodiode provides planarity and compatibility with a silicon LSI. However, the optical detector using Si or SiGe generally shows a slow response due to a long carrier life time (~1 to 10 μs) and a low optical absorption rate (~10 to 100/cm). Furthermore, in the case of a compound semiconductor, a Schottky barrier type photodiode provides a high-speed response, but is problematic because the metal electrodes reduce the effective light receiving area and reduce sensitivity. On the other hand, in the case of a pin-type photodiode, a lateral electrode structure is proposed to reduce the thickness of a depletion layer. This structure can reduce the distance between the electrodes to achieve a high-speed response, but is problematic because it is difficult to achieve high sensitivity.

Enhancement of the response of the photodiode requires a reduction in the thickness of the light absorbing layer that shortens carrier running time and a reduction in the light receiving area, i.e., junction capacity, that reduces the time constant of the circuit. Thus, there generally exists a trade-off relationship between light receiving sensitivity and high-speed response.

Furthermore, a lift-off process using a resist mask is generally used to form electrodes of a Schottky photodiode. However, this process disadvantageously tends to cause a yield reduction in the device manufacturing process, as well as electrical short circuits between electrodes generated by lift-off residues.

The present invention aims at providing a device structure of a photodiode that achieves both light receiving sensitivity and a high-speed response. The present invention also aims at providing a photodiode that achieves a high degree of integration and low power consumption by realizing a light absorbing layer that has a smaller volume than that of related arts by a factor of one hundredth or less. Furthermore, the present invention aims at providing a method for manufacturing a photodiode that is suitable for mass production and for achieving high degree of integration.

DISCLOSURE OF THE INVENTION

The photodiode according to the present invention comprises a semiconductor layer and a pair of metal electrodes which are arranged on a surface of the semiconductor layer at interval d, the pair of metal electrodes forming an MSM junction. The interval d satisfies a relationship $\lambda > d > \lambda/100$, where $\lambda$ is a wavelength of incident light. The pair of metal electrodes is capable of inducing surface plasmon, and at least one electrode of the pair of electrodes forms a Schottky junction with the semiconductor layer. A low end of the pair of metal electrodes is embedded into the semiconductor layer at a depth that is less than $\lambda/2n$, where n is a refractive index of the semiconductor layer.

Since the metal electrode is embedded into the semiconductor layer at a distance that is less than $\lambda/2n$, which is the thickness by which the optical near field permeates from the surface of the semiconductor layer, it is possible to make the region of the maximum optical electric field strength correspond to the semiconductor depletion region, which serves as a light absorbing layer, by producing surface plasmon resonance. Therefore, a highly efficient sensitivity characteristics can be obtained even in the case of a significantly thin light absorbing layer. Furthermore, the small distance d between the metal electrodes enables a high-speed/high sensitivity operation even under a low bias voltage.

In accordance with another embodiment of the present invention, a photodiode comprises: a semiconductor layer; a pair of metal electrodes which are arranged at interval d on a surface of the semiconductor layer; and an opposite electrode that is provided in contact with a surface of the semiconductor layer that is opposite to the surface of the semiconductor layer. The interval d satisfies a relationship $\lambda > d > \lambda/100$, where $\lambda$ is a wavelength of incident light, and the pair of metal electrodes is capable of inducing surface plasmon, at least one electrode of the pair of electrodes forms a Schottky junction with the semiconductor layer, and a low end of the pair of metal electrodes is embedded into the semiconductor layer at a depth that is less than $\lambda/2n$, where n is a refractive index of the semiconductor layer.

In accordance with a further exemplary embodiment of the present invention, a photodiode comprises: a semiconductor layer, a pair of p electrode and n electrode which is arranged at an interval in the semiconductor layer, the pair of p electrode and n electrode forming a pin junction; and a pair of metal films which is arranged at interval d on a surface of the semiconductor layer, stacked on the p electrode and the n electrode. The interval d satisfies a relationship $\lambda > d > \lambda/100$, where $\lambda$ is a wavelength of incident light, and the pair of metal electrodes is capable of inducing surface plasmon, at least one electrode of the pair of electrodes forms a Schottky junction with the semiconductor layer, and a low end of the pair of metal electrodes is embedded into the semiconductor layer at a depth that is less than $\lambda/2n$, where n is a refractive index of the semiconductor layer.

The photodiode may further comprise a light confining structure which is provided remote from the surface of the pair of metal electrodes at a distance of $\lambda/2$ or less, wherein the light confining structure confines incident light within a micro region having an inner diameter of $\lambda$ or less or having an area of 10 $\mu m^2$ or less, the micro region being optically coupled with a region that is interposed between the pair of metal electrodes.

Similarly, the photodiode may further comprise a light confining structure which is provided remote from the surface of the pair of metal films at a distance of $\lambda/2$ or less, wherein the light confining structure confines incident light within a micro region having an inner diameter of $\lambda$ or less or having an area of 10 $\mu m^2$ or less, the micro region being optically coupled with a region that is interposed between the pair of metal films.

The method for manufacturing a photodiode of the present invention includes comprises the steps of: forming a pair of grooves at interval d on a surface of a semiconductor layer by means of etching, the semiconductor layer being formed on a substrate; stacking a metal layer on the semiconductor layer on which the grooves are formed; and etching the metal layer using an ion beam and thereby forming metal electrodes having a depth that is less than $\lambda/2n$ only in the grooves, wherein $\lambda$ is a wavelength of incident light and n is a refractive index of the semiconductor layer.

The method for manufacturing a photodiode of the present invention may further include stacking a conductive material that induces surface plasmon above the metal electrodes with a gap therebetween; and providing the conductive material with a micro opening by means of ion beam etching, wherein the micro opening is provided at a position that is opposite to a region that is interposed between a pair of the metal electrodes.

An optical communication device of the present invention includes the above-mentioned photodiode in a light receiving section.

The optical interconnection module of the present invention includes a silicon substrate, the above-mentioned photodiode formed on the silicon substrate and an LSI electron circuit formed to be monolithic with the photodiode on the silicon substrate.

EFFECT OF THE INVENTION

The present invention realizes a high-speed and highly efficient photodetector that is capable of concentrating optical energy within a region having a wavelength size or a region smaller than the wavelength and that is capable of efficiently converting the energy to photocarriers to obtain an electric signal. Furthermore, the present invention realizes a manufacturing process for a photodiode with a high yield and at low cost even in the case of high degree integration.

BRIEF DESCRIPTION OF THE DRAWINGS

FIG. 1 is a cross-sectional view of a photodiode according to a first exemplary embodiment of the present invention;

FIG. 2 is a cross-sectional view of a photodiode according to a second exemplary embodiment of the present invention;

FIG. 3 is a plan view of a surface plasmon resonance structure;

FIG. 4 is a plan view of a surface plasmon resonance structure provided with metal projections;

FIG. 5 is a schematic diagram of a photodiode provided with a surface plasmon resonance structure;

FIG. 6 is a plan view of a photonic crystal linear defect waveguide;

FIG. 7 is a cross-sectional view of an MSM photodiode according to the first example of the present invention;

FIG. 8 is a plan view of the MSM photodiode shown in FIG. 7;

FIG. 9 is a graph showing the sensitivity characteristics of the photodiode shown in FIG. 7;

FIG. 10 is a cross-sectional view of the photodiode according to the second example of the present invention;

FIG. 11 is a cross-sectional view of a photodiode according to a third example of the present invention;

FIG. 12 is a schematic diagram of the configuration of a surface plasmon resonance structure;

FIG. 13 is a graph showing the comparison of sensitivity characteristics between an MSM photodiode with grating and an MSM photodiode without grating;

FIG. 14 is a cross-sectional view showing an exemplary method for manufacturing a photodiode of the present invention;

FIG. 15 is a conceptual diagram of a light confining structure provided with micro projections;

FIG. 16 is a cross-sectional view of a photodiode according to a sixth example of the present invention;

FIG. 17 is a schematic view showing another photodiode structure using a linear defect type photonic crystal optical waveguide;

FIG. 18 is a graph showing sensitivity characteristics of the photodiode shown in FIG. 17;

FIG. 19 is a cross-sectional view of a photodiode according to a seventh example of the present invention;

FIG. 20 is a cross-sectional view showing a method for manufacturing an optical waveguide of the photodiode shown in FIG. 19;

FIG. 21 is a graph showing sensitivity characteristics of the photodiode shown in FIG. 19;

FIG. 22 is a cross-sectional view of a photodiode according to an eighth example of the present invention;

FIG. 23 is a schematic cross-sectional view of a light receiving module for 40 Gbps transmission on which the photodiode according to the present invention is mounted; and FIG. 24 is a schematic cross-sectional view of an inter-LSI-chip optical interconnection module on which the photodiode according to the present invention is mounted.

| Description of Symbols |
| --- |
| 1 Semiconductor layer |
| 2 Metal electrode |

-continued

Description of Symbols

3 Embedded oxide layer
4 Protection layer
5 Load resistor
6 Bias power supply
7 Oxide film
8 Base substrate
9 P electrode
10 N electrode
11 Metal film
12 Metal film
13 Convex/concave section
14 Micro opening
15 Metal projection
16 Surface plasmon resonance structure
17 High dielectric constant medium
18 Hole
19 Linear defect part
20 Photonic crystal linear defect optical waveguide
21 Electrode pad
22 Schottky electrode
23 Opposite electrode layer
24 Ge selective growth layer
25 Buffer layer
26 Optical waveguide core
27 Clad layer
28 SOI layer
29 SiON core layer
30 Ring-type optical resonator
31 Optical waveguide core
32 Optical fiber
33 Signal light
34 Photodiode
35 Module casing
36 Electric wiring
37 Preamplifier IC
38 Chip carrier
39 VCSEL light source
40 Electric wiring via for light source and modulation
41 Electric wiring via for photodiode
42 LSI
43 Electric wiring layer for light source modulation
44 Electric wiring layer for photodiode
45 Optical signal output fiber
46 Optical signal input fiber
47 LSI mounting board
48 Concave mirror
49 Photodiode/light source mounting board
51 First metal film
52 Second metal film

BEST MODE FOR CARRYING OUT THE INVENTION

The photodiode of the present invention is a photodiode that is provided with a MSM (metal-semiconductor-metal) junction arranged on a semiconductor surface at interval d or a photodiode that is provided with a pin junction formed on a semiconductor surface at an interval and metal films stacked thereon at interval d. Interval d is less than light wavelength $\lambda$ of incident light and greater than $1/100$ of light wavelength $\lambda$. The metal film used for the MSM junction or for the pin junction is made of a conductive material that is capable of inducing surface plasmon, and the low end thereof is located at a position embedded into the semiconductor at a distance that is less than $\lambda/2n$ measured from the surface of the semiconductor, where n is the refractive index of the semiconductor layer. Furthermore, a structure for confining light within a region of light wavelength $\lambda$ or less or within a region of 10 $\mu m^2$ or less is provided remote from the surface of the metal film used in the MSM junction or the pin junction at a distance of $\lambda/2$ or less, and the structure is optically coupled with the MSM photodiode or the pin photodiode. Here, the above mentioned region means a light spot size on the surface of the semiconductor layer.

FIG. 1 is a cross-sectional view of a photodiode according to a first exemplary embodiment of the present invention. Embedded oxide layer 3 is formed on base substrate 8, and semiconductor layer 1, which is a light absorbing layer, is formed thereon. Semiconductor layer 1 is surrounded by oxide film 7. Metal electrodes 2 are formed on the surface of semiconductor layer 1. A pairs of metal electrodes 2 is arranged at interval d that is less than wavelength $\lambda$ of incident light, forming an MSM junction. Metal electrodes 2 are embedded into semiconductor layer 1 at distance f that is less than $\lambda/2n$, where n is the refractive index of semiconductor layer 1. Metal electrodes 2 consist of first metal film 51 that forms a Schottky junction with semiconductor layer 1 and second metal film 52 made of a conductive material that is capable of inducing surface plasmon. However, first metal film 51 and second metal film 52 can also be formed of one type. In this case, metal electrodes 2 have a one-layer configuration.

Conventionally, a metal electrode formed on the surface of the semiconductor layer covers the light receiving surface of a photodiode, causing a problem of deterioration of light receiving sensitivity. Even when an electrode interval that produces surface plasmon resonance is chosen, photocarriers disadvantageously can not be generated efficiently because the region subject to high optical electric field strength is outside the semiconductor. On the contrary, by embedding the metal electrodes into the semiconductor layer at a distance that is less than $\lambda/2n$, which is a distance by which an optical near field can permeate, measured from the surface of the semiconductor layer, and by causing plasmon resonance through radiation of TM wave, the region having the maximum optical electric field strength and the region of the semiconductor depletion layer, which serves as a light absorbing layers can coincide. Therefore, even a significantly thin light absorbing layer can provide highly efficient sensitivity characteristics.

Furthermore, when a Schottky junction is formed between a metal and a semiconductor on the condition that a doping concentration ranges between $10^{15}$ and $10^{16}$ cm$^{-3}$, the region of a depletion layer having a width of 200 nm or more is formed even under a zero bias. Accordingly, a reduction in the distance between electrodes enables a high-speed and highly sensitive operation of a photodiode even under a low bias voltage.

If the thickness of semiconductor layer 1 is set to 200 nm or less, then drift time between the electrodes required for photocarriers is estimated to be several ps even in the case of a semiconductor material, such as Si, whose photocarrier mobility is about $10^7$ cm/s. Even when the thickness of semiconductor layer 1 is set to 1 $\mu$m or less, the drift time can be reduced to 20 ps or less. Furthermore, when distance d between metal electrodes 2 is set to about 100 nm, a junction electric capacitance that is equal to or less than 10 fF can be ensured by setting the MSM junction area to 10 $\mu m^2$ or less and a junction electric capacitance that is equal to or less than 100 fF can be ensured by setting the MSM junction area to 100 $\mu m^2$ or less. Accordingly, supposing a load resistance of 50$\Omega$, the time constant of the circuits become 1 ps and 10 ps, respectively. Thus, a significantly high-speed response is realized. It should be noted that the junction area in the case of an MSM junction means the area measured from one end of the plurality of MSM electrodes to the other end thereof. In the case of a pin junction, which has a lateral pin structure in the present invention, the junction area means the area measured from one end of the plurality of p and n electrodes to the other end thereof.

The present invention is also applicable to a case in which one metal-semiconductor junction is made of a Schottky barrier type junction and the other metal-semiconductor junction is made of an ohmic junction. Also in this case, if interval d is formed to be less than light wavelength λ and if the electrodes made of a conductive material that is capable of inducing surface plasmon are embedded into the semiconductor at a distance that is less than λ/2n, photodiode characteristics that realize both high efficiency and improved response can be obtained. The same applies to a structure in which Schottky junctions are arranged on the semiconductor surface at a certain interval and an opposite electrode is formed on the side of the substrate via a depletion layer that serves as a light absorbing layer.

FIG. 2 is a cross-sectional view of a photodiode according to a second exemplary embodiment of the present invention. In semiconductor layer 1, p electrode 9 and n electrode 10 are provided at a predetermined interval, forming a pin junction. Metal films 11 made of a conductive material that is capable of inducing surface plasmon are formed on p electrode 9 and n electrode 10 such that metal films 11 are exposed on the surface of semiconductor layer 1. Interval d of metal film 11 stacked on p electrode 9 or n electrode 10 is less than wavelength λ of incident light and greater than 1/100 of λ. Metal films 11 are embedded into semiconductor layer 1 at distance f that is less than λ/2n measured from the surface of semiconductor layer 1, where n is the refractive index of semiconductor layer 1.

Metal films 11 that are embedded into the semiconductor layer at distance f that is less than λ/2n measured from the surface of semiconductor layer 1 can, also when applied to the pin photodiode having a lateral electrode structure as shown in FIG. 2, confine optical energy within the region interposed between p electrode 9 and n electrode 10 of semiconductor layer 1 through surface plasmon, producing a locally intensive optical electrical field distribution. It has conventionally been reported that a reduction in the distance between electrodes of a pin photodiode having a lateral electrode structure leads to enhanced response. On the other hand, according to the present invention, further by stacking metal films 11 that are capable of inducing surface plasmon on p electrode 9 and n electrode 10 and by embedding metal films 11 at distance f that is less than λ/2n measured from the surface of semiconductor layer 1, which serves as a light absorbing layer, a photodiode having a high speed response and highly efficient sensitivity characteristics can be obtained. Furthermore, the conductive material that is capable of inducing surface plasmon is generally made of a material having high conductivity. This significantly contributes to a reduction in impedance in high frequency regions of a downsized photodiode. Thus, a photodiode that realizes both high-speed/high-sensitivity and a high SN ratio in high frequency regions can be obtained.

FIG. 3 is a plan view of a surface plasmon resonance structure that functions as a light confining structure that confines incident light within a size (an inner diameter) that is equal to or less than the light wavelength. Generally, no light propagation mode exists in a micro opening, formed in a metal film, having a size that is equal to or less than the wavelength. Therefore, transmission efficiency of incident light is significantly small. On the other hand, by providing periodic convex/concave section 13 around micro opening 14 formed in metal film 12, which is a conductive film, as shown in FIG. 3, the incident light can be coupled with surface plasmon that is induced on the surface of metal film 12 and optical energy can be concentrated within micro opening 14 in the form of surface plasmon, and accordingly, transmitted light can be significantly intensified. This effect is called a "surface plasmon enhancement effect." "Periodic" means that concave parts and convex parts are alternately and concentrically distributed about micro opening 14.

Concentration of surface plasmon that is generated on the surface of metal film 12 induces a strong near field on the light emitting side of micro opening 14 via micro opening 14. The induced near field is produced by the scattering of the surface plasmon, which is concentrated on the light incident side, at the edge of micro opening 14. The surface plasmon includes a component that locally exists as a near field and a component that is scattered and converted to propagating light.

The dispersion relation of surface plasmon is expressed by the following Formula 1.

[Formula 1]

$$k_{SP} = \omega/c \sqrt{(\epsilon_m \cdot \epsilon_d)/(\epsilon_m + \epsilon_d)}$$

where $\epsilon_m$ and $\epsilon_d$ are a dielectric constant of metal that produces surface plasmon and a dielectric constant of a dielectric substance adjacent to the metal, respectively.

Furthermore, the propagation length of surface plasmon is expressed by the following Formula 2.

[Formula 2]

$$L_{SPP} = c/\omega \left((\epsilon_m' + \epsilon_d)/\epsilon_m'\right)^{3/2} \cdot \epsilon_m'^2 / \epsilon_m''$$

where complex dielectric constant $\epsilon_m$ of the metal is expressed as $\epsilon_m' + i\epsilon_m''$.

Thus, the optical loss of the surface plasmon largely depends on the ratio of the imaginary part to the square of the real part of the dielectric constant of the metal film. Metal film 12 is preferably made up of aluminum, silver, gold or copper or an alloy layer made up of two or more of the elements aluminum, silver, gold and copper. Furthermore, reducing the size of randomly arranged convex and concave parts on the metal surface significantly contributes to a reduction in the propagation loss of the surface plasmon. Therefore, it is also effective to use Ta, Cr, Ti, Zr or the like as a seed layer or to add a trace of an element, such as Nb, to metal film 12 to form an alloy thereof.

Furthermore, forming at least one metal projection in micro opening 14 allows surface plasmon to excite dipole resonance, allowing a stronger optical near field to be emitted from the outlet of micro opening 14. As shown in FIG. 4, a structure having at least one pair of metal projections 15 opposite to each other intensifies the optical near field in a smaller region.

Such metal projections 15, which are intended to produce localized plasmon resonance, are preferably made up of aluminum, silver, gold or copper from the same viewpoint as the viewpoint regarding the optical loss of surface plasmon. Alternatively, metal projections 15 may also be an alloy layer including two or more of the elements aluminum, silver, gold and copper.

FIG. 5 is a schematic diagram of a photodiode provided with a surface plasmon resonance structure, wherein (a) and (b) illustrate a plan view and a cross-sectional view, respectively. Metal electrode 2 is formed at the location remote from the outlet of micro opening 14 at distance g that is equal to or less than λ/2, and is optically coupled with micro opening 14. Accordingly, both the near field component and the propagating light component at the outlet of micro opening 14 can be localized in the form of plasmon within the region equal to or less than the wavelength on the surface of semiconductor layer 1.

As for the intensity distribution of an optical near field generated by the surface plasmon, the intensity and the permeation range vary according to the effect of arrangement of the MSM electrodes, the refractive index of the semiconductor layer and the absorption coefficient of the semiconductor layer. This variation enables generation of electron/hole pairs (photocarriers) in a very small region of the semiconductor layer. Therefore, it is possible to make the depletion region in the semiconductor layer formed by the MSM electrodes coincide with the region in which photocarriers are generated by the near field. Thus, efficient formation of photocarriers and local propagation of the photocarriers can be achieved and a photodiode having high quantum efficiency and high-speed response characteristics can be obtained. Furthermore, the junction region of the metal electrodes to generate and sweep photocarriers can be set to a size of 10 $\mu m^2$ or less. As a result, it is possible to reduce the junction electric capacitance to an extremely small level. Therefore, the time constant of the circuit of a photodiode operating at a high frequency can be set to several picoseconds or less and a high frequency operation at more than several tens of GHz is realized.

In order to confine light within a size (an inner diameter) equal to or less than the light wavelength, it is also effective to use a two-dimensional photonic crystal. A two-dimensional photonic crystalline body has a structure in which photonic crystal holes having micro diameters are arranged in a medium having a high dielectric constant in a staggered pattern or in a lattice pattern. A semiconductor (most semiconductors have a specific dielectric constant of approximately 12) is typically used for the high dielectric constant medium. In the case of a two-dimensional staggered-patterned photonic crystal, a rough evaluation of the combination of the hole pitch (lattice constant) and the hole diameter that can realize a photonic band gap is disclosed, for example, in "Photonic crystals, Modeling the Flow of Light" p 125 to 126 ("J. D. Joannopoulos, R. D. Meade and J. N. Winn, Princeton University Press, pp. 125 to 126). Assuming the radius of the hole to be r, the pitch of the circular holes of the photonic crystal to be a, the angular frequency of light to be $\omega$ and the light velocity in vacuum to be c, and assuming a case in which circular holes in the photonic crystal are arranged in a staggered pattern on a dielectric substrate having a dielectric constant of 11.4, a photonic band gap occurs when (r/a) is 0.48 and $\{(\omega \times a)/(2\pi \times c)\}$ is approximately 0.5, irrespective of the vibration direction of electric field or the direction in which holes extend.

FIG. 6 is a plan view of a photonic crystal linear defect waveguide manufactured by using a two-dimensional staggered-patterned photonic crystalline structure. Photonic crystal linear defect optical waveguide 20 is formed by arranging two two-dimensional staggered-patterned photonic crystalline structures adjacent to each other. A large number of holes 18 are arranged in a staggered pattern in high dielectric constant medium 17. One column in which no hole is formed, i.e., linear defect part 19, is formed in the intermediate region of a large number of holes 18. Thus, light having angular frequency within the photonic band gap is prevented from propagating through the perfect crystal section, which is the section other than linear defect part 19, but the light is permitted to propagate through linear defect part 19. This means that linear defect part 19 functions as an optical waveguide that confines a photoelectric field distribution within a size equal to or less than the wavelength. According to the present invention, a MSM photodiode is arranged adjacent to such an optical waveguide having high performance in confining light at a distance of half the light wavelength or less. Therefore, optical coupling in a significantly limited region is achieved, and as a result, both high sensitivity and high speed are achieved.

In order to confine light within a size equal to or less than the wavelength or equal to or less than 10 $\mu m^2$, it is also possible to use an optical waveguide having a difference of 5% or more in a refractive index between the core and the clad layer. Such a channel type optical waveguide has a structure in which the core is surrounded by a medium having a smaller refractive index than the core, and it is known that light propagates while repeating total reflection caused by the difference in the refractive index between the core and clad layer. In this case, if the difference in the refractive index between the core and the clad layer is large, light is tightly confined in the core and even when the waveguide is sharply bent with a small curvature, light is guided along the waveguide, A difference in the refractive index of 5% or more can realize an optical spot diameter of 10 $\mu m$ or less. Furthermore, by setting the difference in the refractive index between the core and the clad layer to about 10 to 40%, an optical spot diameter equal to or less than the wavelength can be realized. It should be noted that the optical waveguide can be made of a dielectric material, organic compound or semiconductor material.

If a waveguide core is made of semiconductor, such as Si or the like, and if the waveguide core has a refractive index of 3.4 and a cross section of about 0.3 $\mu m \times 0.3$ $\mu m$, and if the core is covered with a clad layer made of $SiO_2$ having a refractive index of about 1.5, then the mode size of light can be substantially reduced to the size of the waveguide core. When guided light has a wavelength of about 850 nm, waveguide loss is generated due to optical absorption. However, a difference in the refractive index of 5% or more can be obtained by forming the waveguide core from SiON or the like, which exhibits a light transmitting characteristics showing negligible waveguide loss over a wide wavelength range, and by covering the waveguide core with a clad made of $SiO_2$: In this case, the light confining performance is relatively weakened compared to a case in which a semiconductor core is used, and an optical spot diameter of about 1 to 4 $\mu m$ is obtained.

By arranging a MSM photodiode adjacent to such an optical waveguide having high performance in confining light at a distance half the light wavelength or less, optical coupling in a significantly limited region is achieved, and as a result, both high sensitivity and high speed are achieved.

When such a photonic crystal type optical waveguide or a channel type optical waveguide having high performance in confining light is coupled with a MSM photodiode, it is possible to realize sufficient optical coupling even when the end surface of the waveguide is slantly cut and bent or placed on the adjacent lateral side so that guided light is incident on the MSM junction from a direction perpendicular to the MSM junction. In this case, the light propagation mode is preferably arranged at substantially the same height as the light absorbing layer of the MSM photodiode.

Furthermore, by providing a ring structure of the channel type optical waveguide having high performance in confining light in order to form a resonator structure, the group velocity of the guided light can be reduced. By arranging the MSM junction remote from the waveguide by half the light wavelength or less, optical energy can be more efficiently converted to a photocurrent. In this case, the ring-type optical resonator structure is preferably disposed above the MSM photodiode or on the lateral side thereof for optical coupling.

A dielectric film which serves as an optical coupling medium may be provided between the metal electrode and the light confining structure.

In order to form metal electrode 2 of the Schottky barrier type photodiode that uses an MSM junction or to form electrodes 9, 10 and metal film 11 on a lateral pin junction, a gas cluster ion beam is preferably used. The same applies when micro opening 14 is formed in a surface plasmon resonance structure. The gas cluster ion beam is a beam obtained by ionizing Ar or reactive gas and gathering it as a cluster made of several hundreds to several thousands of atoms or molecules. Use of the gas cluster ion beam, in place of a lift-off process using a resist mask, improves processing accuracy, thereby realizing a work process that causes less damage than a process using the ion beam etching. Metal residue generated by etching is released into a vacuum or sticks to side walls of the resist mask. Therefore it is possible to efficiently remove the residue simultaneously with the resist. Thus, the gas cluster ion beam, when applied to an LSI process, improves yield in a high integration process and provides devices at a low cost.

The light wavelength used in the present invention ranges over a wide wavelength range that includes visible light, near-infrared light and infrared light. However, a high-speed photodetector for obtaining an electric signal that efficiently generates photocarriers in a wavelength range equal to or less than the wavelength can be obtained by adjusting the sizes of the metal periodic structure that induces surface plasmon resonance, the sizes of a photonic crystal optical waveguide, a channel type optical waveguide and a ring-type optical waveguide that efficiently confine and transmit light and MSM electrodes.

Next, examples of the present invention will be explained in detail with reference to the accompanying drawings.

EXAMPLE 1

FIGS. 7 and 8 are a cross-sectional view and a plan view of an MSM photodiode according to a first example of the present invention, respectively. The MSM type photodiode forms metal-semiconductor-metal (MSM) junctions that are formed on part of semiconductor layer 1 having an insulated surface, such as an SOI (Silicon-on-Insulator). Interval d between metal electrodes 2 is less than wavelength λ of incident light and larger than 1/100 λ. Assuming n is the refractive index of semiconductor layer 1, metal electrodes 2 are embedded into semiconductor layer 1 at distance f that is less than λ/2n measured from the surface of semiconductor layer 1. In order to induce surface plasmon, aluminum, silver, gold or copper or an alloy made up of two or more of the elements aluminum, silver, gold and copper is preferably used for metal electrode 2 (or at least second metal film 52). A seed film made of Cr, Ta, Ni etc. may also be used in order to form a Schottky junction. Furthermore, a seed film made of Ti or the like may be used as an opposite electrode film in order to form an ohmic junction. Protection layer 4 made of $SiO_2$ or the like may also be formed on metal electrodes 2 and may be used as an optical anti-reflection film.

FIG. 9 shows a comparison of sensitivity characteristics between a case in which Ag electrodes having 30 nm thickness are formed on the surface of a Si semiconductor without being embedded and a case in which the electrodes are embedded at a distance less than λ/2n measured from the surface of the semiconductor. The width of the metal electrodes that form the MSM junction and the gap between the electrodes were both set to 100 nm and the embedment depth of the metal electrodes was set to 30 nm. Since the resonance wavelength of surface plasmon was estimated to be 850 nm based on an electromagnetic field calculation, a laser light having a wavelength of 850 nm and 1 mW power was radiated in order to observe photocurrent. It was found that the configuration in which the Ag electrodes are embedded into the Si semiconductor provided a photocurrent that is increased by a factor of hundred or more, and the quantum efficiency was estimated to be about 30% in this case.

EXAMPLE 2

FIG. 10 is a cross-sectional view of a photodiode according to a second example of the present invention. Schottky electrodes 22 forming a Schottky junction are arranged at interval d on the surface of semiconductor layer 1. Schottky electrodes 22 are made of a conductive material that is capable of inducing surface plasmon. Opposite electrode layer 23 is formed on the side of base substrate 8 via a depletion layer (semiconductor layer 1) which serves as a light absorbing layer. Interval d of Schottky electrodes 22 is less than light wavelength λ. Assuming that n is the refractive index of semiconductor layer 1 Schottky electrodes 22 are embedded into semiconductor layer 1 at distance f that is less than λ/2n.

An n+-Si layer that includes a dopant, such as P, with a dopant concentration of $1 \times 10^{20}$ cm$^{-3}$ or more may be used as opposite electrode layer 23 and an n-Si layer which serves as a light absorbing layer may be used as semiconductor layer 1. Semiconductor layer 1 requires epitaxial growth on opposite electrode layer 23. However, if the growth temperature goes beyond 800° C., then the dopant concentration in the light absorbing layer increases due to thermal diffusion of the dopant element, leading to an increase in the depletion voltage and a decrease in the thickness of the depletion layer when the Schottky junction is formed. As a result, low voltage and high speed operation becomes difficult. Therefore, in order to form a thin light absorbing layer on the n+-Si layer, a technique for performing the epitaxial growth at a low temperature of 600° C. or less is required.

The effect of enhancing the photoelectric field by surface plasmon resonance can be generated not only in the horizontal direction between electrodes but also below the electrodes. This example is designed such that the enhancement of the photoelectric field by surface plasmon occurs on a Schottky junction interface below the electrodes and thereby the region in which photocarriers are generated coincides with the region in which depletion occurs due to application of a bias voltage.

EXAMPLE 3

FIG. 11 is a cross-sectional view of a photodiode according to a third example of the present invention. A stack in which metal film 11 is deposited on p electrode 9 or n electrode 10 is disposed on the surface of semiconductor layer 1, forming at least one p-i-n junction. Interval d of metal films 11 deposited on p electrode 9 or n electrode 10 is designed to be less than wavelength λ of incident light and to be greater than 1/100 λ. Metal film 11 is made of a conductive material that is capable of inducing surface plasmon and metal film 11 is embedded into semiconductor layer 1 at distance f that is less than λ/2n measured from the surface of semiconductor layer 1, where n is the refractive index of semiconductor layer 1. Metal film 11 is preferably made up of aluminum, silver, gold or copper or an alloy made up of two or more of the elements aluminum, silver, gold and copper in order to induce surface plasmon.

In order to manufacture the photodiode of this example, first, trench structures are formed on an SOI (Silicon-on-Insulator) substrate at an interval that is less than light wavelength λ by means of reactive etching using $C_4F_8$ and $SF_6$. Next, p type and n type polysilicon layers are selectively grown in the trench structures by means of the organic metal vapor-phase epitaxial method. Selective growth is stopped halfway in the trench structures and then aluminum, gold, silver or copper or the like, which are conductive materials that are capable of inducing surface plasmon, is stacked via a seed layer, made of Ti or the like, that improves adhesion to the polysilicon layer. An insulating layer made of $SiO_2$ or the like having a thickness of several nm may be inserted between the conductive material and the i layer (semiconductor layer 1), which serves as a light absorbing layer, in order to limit dark current. A quantum efficiency of 50% or more can be achieved even in the case of a Si photodiode by causing enhancement of the optical near field due to surface plasmon to occur in the i layer, which serves as a light absorbing layer and which is interposed between the metal electrodes. Furthermore, a quantum efficiency of 90% or more can be achieved in the case of a photodiode in which a Ge layer is grown as an absorbing layer.

EXAMPLE 4

As a fourth example of the present invention, a surface plasmon resonance structure that is combined with the above-mentioned MSM junction will be described. FIG. 12 is a schematic diagram illustrating the configuration of a surface plasmon resonance structure that functions as a light confining structure, wherein (a) is a plan view and (b) is a cross-sectional view. Surface plasmon resonance structure 16 has metal film 12 made of Ag etc. which includes a grating configuration (convex/concave section 13) that produces surface plasmon resonance and micro opening 14 that has a diameter of $\lambda$ or less formed in the center thereof. Surface plasmon resonance structure 16 is provided remote from the MSM junction at a distance $\lambda/2$ or less and confines incident light within a region equal to or less than the wavelength. The period of the grating structure is set such that plasmon resonance occurs for the wavelength of incident light. The grating may have a triangular shape or a sinusoidal shape etc. in addition to the rectangular cross section shown in FIG. 12(b). These shapes shift the resonance wavelength to a shorter side as compared to the rectangular cross section. Alternatively, instead of the grating configuration, a multi-layered structure obtained by periodically arranging two or more types of media whose dielectric functions are different from each other may be used.

FIG. 13 shows a comparison of sensitivity characteristics between a MSM photodiode with a grating configuration that produces plasmon resonance and a MSM photodiode that does not have such a grating configuration. The wavelength of incident light was 840 nm and power was 1 mW. By forming a grating structure, an increase in photocurrent by a factor of hundred or more and a quantum efficiency of 50% or more was achieved.

(Manufacturing Method)

Next, the method for manufacturing the above-mentioned photodiode will be explained using the first and fourth examples as examples. FIG. 14 is a cross-sectional view illustrating the process for manufacturing the photodiode of the present invention.

First, an n doped SOI substrate as shown in FIG. 14(a) was prepared. Specifically, embedded oxide layer 3 was formed on Si base substrate 8. The resistivity of base substrate 8 was about 1 to 10Ω·cm, and doping concentration was about $10^{15}$ to $10^{16}$ cm$^{-3}$.

Next, n type SOI layer (semiconductor layer 1) was subjected to patterning by means of reactive etching that uses a SiNx film as mask 61 and a junction size was defined, as shown in FIG. 14(b). A mixture of $C_4F_8$ and $SF_6$ gases was used as a reactive gas. Then, in-vapor thermal processing was applied at 1000° C. for about 140 minutes to form a mesa structure that was to be a base structure for manufacturing the MSM junction. The sides of semiconductor layer 1 were covered with oxide film 7.

Next, mask 61 was removed by placing mask 61 in hot phosphoric acid at approximately 130° C. for approximately one hour, as shown in FIG. 14(c). In this process, a relatively flat surface can be obtained by optimizing the mesa shape and the thermal oxidation processing. A flatness of about several nm can be realized by further applying chemical polishing (CMP).

Next, a metal layer for forming a Schottky junction was formed on the surface of the manufactured mesa shape. Specifically, groove patterns 62 were formed at interval d on the surface of the semiconductor mesa by means of reactive etching, as shown in FIG. 14(d), and then, metal electrodes 2 were stacked, as shown in FIG. 14(e). More specifically, a metal layer was deposited on semiconductor layer 1 on which groove patterns 62 were formed. Then, a resist pattern (not shown) was formed on groove patterns 62. Then, the metal layer in the region other than the region covered with the resist pattern was removed by etching using Ar gas cluster ions, and metal electrodes 2 were formed in groove patterns 62. As a result, a structure in which metal electrodes 2 are embedded in semiconductor layer 1 was formed. Adjustment of distance d of metal electrodes 2 formed in groove patterns 62 makes it possible to generate plasmon resonance of a desired wavelength, improving light receiving efficiency of the MSM photodiode by a factor of hundred or thousand.

Next, as shown in FIG. 14(f), protection film 4, made of $SiO_2$ or the like, that shows negligible optical absorption was formed on the MSM photodiode that has been manufactured. Protection film 4 serves as a medium layer when the light confining structure, which is formed above the MSM photodiode in the subsequent process, is optically coupled with the MSM photodiode. Protection film 4 preferably has a film thickness of $\lambda/n_{pas}$ or less, where $\lambda$ is a light wavelength to be detected, and $n_{pas}$ is the refractive index of protection film 4.

Next, as shown in FIG. 14(g), periodic grooves 63 were formed on protection film 4 by means of reactive etching in order to form a grating that generates surface plasmon resonance on protection film 4. Then, as shown in FIG. 14(h), metal film 12 made of Ag or Au which serves as a medium for exciting surface plasmon was deposited by means of a sputtering method or a vapor deposition method. In this case, it is also possible to form a seed layer made of Cr or Ti or the like in order to improve crystallinity and smoothness of the Ag film or the Au film.

Finally, as shown in FIG. 14(i), micro opening 14 having a size equal to or less than the wavelength was formed at the center of the manufactured grating configuration (at a location opposite to metal electrodes 2) by means of an etching process using Ar gas cluster ions. A resist mask or a hard mask, such as a $SiO_2$ mask, was used as the mask. Furthermore, in order to monitor the amount of etching, a mass spectrometer was mounted on the etching apparatus so that the end of etching was detected with an accuracy of 0.1 nm or less.

An example of a method for manufacturing MSM photodiodes was described, but a similar manufacturing method may also be applicable to the p-i-n junction according to the second or third examples. In the case of the third example, in the step shown in FIG. 14(e), p electrode layers, n electrode layers and metal layers are deposited on the semiconductor layer on which the groove patterns are formed such that the p electrode layer or the n electrode layer is selectively deposited in each groove and then the metal layers are deposited on the p electrode layers and the n electrode layers.

EXAMPLE 5

FIG. 15 is a conceptual diagram of a light confining structure provided with micro projections. As shown in (a), metal projection 15 that produces dipole resonance through plasmon is provided in micro opening 14, which is formed at the center of convex/concave section 13 that generates surface plasmon resonance. Metal projections 15 protrude from the periphery of micro opening 14 into micro opening 14. Providing such a metal projection configuration allows optical energy to be confined within a region of ¼ or less of the light wavelength, making it possible to further reduce the MSM junction that is optically coupled with the region and thereby to obtain a high-speed response of the order of 100 GHz. Furthermore, as shown in (b) and (c), metal projection configuration 15 may also be constituted as at least one pair of metal projections that are opposite to each other. This significantly improves dependency of incident light on polarization.

In the first to third examples mentioned above, elements other than Si that belong to IV group semiconductors, such as Ge, $Si_xGe_{1-x}$, SiGe, may also be used as the semiconductor layer. Furthermore, a III-V group compound particle semiconductor, such as GaN, GaAs, GaInAs, GaInP and InP may also be used. These materials are selected based on a wavelength limitation that is determined by the band gap and the absorption coefficient. Excellent photodiode characteristics are obtained in the wavelength range of 400 to 900 nm in the case of Si, 400 to 1400 nm in the case of Ge and 1300 to 1600 nm in the case of InGaAs grown on InP. When Ge is used, the absorbing layer is formed by making a Ge layer grow with high crystallinity by using a GOI (Germanium On Insulator) substrate instead of an SOI substrate or by using Si substrate according to the metal organic chemical vapor deposition method or the molecular beam epitaxy method. It is known that Ge is not suitable for forming a Schottky junction. Therefore, a Schottky junction is preferably formed on a NiGe alloy layer, which is made by vapor-depositing Ni or the like on Ge, and by performing annealing at a temperature about 400 to 600° C. Furthermore, it is possible to improve the efficiency for coupling with optical near field emitted from the micro opening by forming a film having small propagation loss of surface plasmon, such as Ag or Au, on the alloy layer.

EXAMPLE 6

FIG. 16 is a cross-sectional view of a structure in which an MSM photodiode is coupled with a photonic crystal optical waveguide. The photonic crystal optical waveguide was formed using an SOI substrate provided with a Si layer having a thickness of 200 to 400 nm. First, a resist for electron beam exposure is applied to the surface of the substrate. Next, a resist pattern with cylindrical holes arranged in a matrix pattern was formed using an electron beam exposure apparatus. The resist pattern has a hole diameter of 200 to 240 nm with an array pitch of 340 to 380 nm. After forming the resist mask, cylindrical holes having the same shape as in the resist mask pattern were formed on the Si surface layer of the SOI substrate by means of the reactive ion etching method, and the resist was then removed.

It is known that periodically arranged holes form a photonic band gap, allowing no light propagation mode for angular frequencies that correspond to the band gap. Therefore, as shown in FIG. 16, it is possible to confine the photoelectric field distribution within a size that is equal to or less than the wavelength by using linear defect type photonic crystal waveguide 20 in which such a photonic band gap is disposed adjacent to linear optical waveguide.

FIG. 17 is a schematic view illustrating the structure of another photodiode using a photonic crystal optical waveguide of a linear defect type, wherein (a) is a plan view and (b) is a cross-sectional view. The MSM photodiode is formed by thinning a Si layer using etching and by making buffer layer 25, which mitigates grating distortion, and selective growth layer 24 made of SiGe or Ge, which serves as a light absorbing layer, grow on the thinned Si layer using metal organic chemical vapor deposition. The MSM photodiode is provided at an end of photonic crystal optical waveguide 20. The growth end position of the SiGe layer or the Ge layer is controlled by the selective vapor phase epitaxy method so that the distance between the end of the optical waveguide and the MSM electrode is equal to or less than the wavelength in order to allow the MSM photodiode to be optically coupled with photonic crystal linear defect optical waveguide 20.

FIG. 18 shows the dependency of a photocurrent on bias voltage when a laser light having a wavelength of 1330 nm and power of 1 mW is radiated. Although the effect of waveguide loss was present in the photonic crystal linear defect optical waveguide, a quantum efficiency of about 30% was obtained.

EXAMPLE 7

FIG. 19 is a cross-sectional view of a structure in which an MSM photodiode is coupled with a channel type optical waveguide. The channel type optical waveguide has optical waveguide core 26 that is made of SiON and clad layer 27 that has a refractive index that is largely different from that of optical waveguide core 26. The channel type optical waveguide is manufactured as follows. First, as shown in FIG. 20(a), a portion of the Si layer (SOI layer 28) on the SOI substrate on which the optical waveguide is to be formed is etched by means of the reactive etching and the $SiO_2$ layer which is to become the clad layer is exposed. Next, as shown in FIG. 20(b), a $SiO_2$ layer (protection layer 4) which is to become the clad is stacked thereon. Then, SiON core layer 29 is grown by means of a plasma CVD method using $SiH_4$, $NH_3$ and $O_2$ so that the difference in the refractive index between the core and clad becomes 5% or more. Then, annealing is conducted at 700 to 1300° C. in order to reduce absorption caused by the O-H group or N-H group to improve crystallinity. Next, in order to form the core shape, SiON core layer 29 is etched into a rectangular shape having a width of 0.7 to 4 μm by means of the reactive etching method. Subsequently, a $SiO_2$ layer, which serves as an upper clad layer, is grown to a thickness of about several μm by means of a plasma CVD method that uses a source gas made of a mixture of TEOS (tetraethylorthosilicate), bubbled with a large amount of Ar, and $O_2$. Thus, an optical waveguide was obtained.

Next, as shown in FIG. 20(c), the end face of optical waveguide 29 thus formed was etched at a predetermined angle, and an optical waveguide structure, which is irradiated by the MSM photodiode having a spot diameter of about several μm, was formed at a distance half the wavelength or less as measured from the position at which the MSM photodiode was formed. Subsequently, the surface the Si layer on the SOI substrate adjacent to the optical waveguide layer was subjected to reactive etching. Thus, the MSM photodiode was manufactured and coupling with light from the SiON optical waveguide was realized.

FIG. 21 shows dependency of a photocurrent on a bias voltage when a laser light having a wavelength of 850 nm and power of 1 mW was radiated. A quantum efficiency of about 50% was obtained because a $SiO_2$ layer was formed between the SiON optical waveguide and the MSM photodiode to improve the efficiency of optical coupling with the MSM photodiode.

EXAMPLE 8

FIG. 22 is a conceptual diagram of a photodiode using a channel type TO optical waveguide of a ring structure. The channel type optical waveguide using a Si core is provided with ring-type optical resonator structure 30. Optical resonator structure 30 is disposed at a distance of λ/2 or less measured from an MSM photodiode using a light absorbing layer made of a SiGe layer. Use of such an optical resonator structure makes it possible to reduce the group velocity of light to ⅙ or less and a quantum efficiency of 70% or more was obtained in the case of a laser light having a wavelength of 1330 nm.

EXAMPLE 9

FIG. 23 shows a schematic cross-sectional view of a 40 Gbps (giga-bits per sec) transmission light receiving module on which the MSM photodiode of the present invention is mounted. Photodiode 34 is an MSM photodiode that uses a substrate obtained by epitaxial growth of a Ge film on a SOI substrate and that is obtained by forming Au electrodes thereon. A light confining structure provided with a metal periodic structure made of Ag or Au is disposed at a distance of λ/2 or less. In the case of transmission using near-infrared ray having a wavelength of 1.55 μm, the convex/concave pitch of the metal periodic structure is approximately 1.2 μm. When a concentric convex/concave structure in eight circles is used, the diameter of the outer perimeter becomes approximately 20 μm. The depth of the convex/concave structure was about 0.1 to 0.4 μm. The diameter of the hole was about 0.3 to 0.7 μm. Photodiode 34 is mounted on chip carrier 38 and optically coupled via optical fiber 32 and a lens. Photodiode 34 is also electrically connected to preamplifier IC 37 via electric wiring 36.

Generally, a photodiode that is mounted inside a 40 Gbps optical receiver module uses a side incident type waveguide. This is because a planar incident type in which light is incident on a semiconductor surface can not obtain high quantum efficiency if an absorbing layer has a small thickness in order to realize a short charge carrier running time. On the other hand, the waveguide type can obtain high quantum efficiency even if the charge carrier running time is short because this type absorbs light in the in-plane direction of the absorbing layer. However, the absorbing layer of the 40 Gbps waveguide type device normally has a thickness of 1 μm or less, and in this case, the positional coupling tolerance with respect to the optical fiber has to be about ±1 μm. This is a large problem both with packaging design and manufacturing cost.

On the other hand, the photodiode according to the present invention has an effective diameter of 20 μm, ensuring a coupling tolerance of ±2 μm or more. As a result, optical coupling can be achieved only with simple lens coupling, and this enables a reduction in the cost of a receiver module for optical transmission. The 40 Gbps optical receiver module according to the present invention shown in FIG. 23 exhibits a minimum receiving sensitivity of −12 dBm in the case of a transmission using a wavelength of 1.55 μm, and it was confirmed that the 40 Gbps optical receiver module according to the present invention matches, in performance, a 40 Gbps receiver module on which a typical waveguide type photodiode is mounted.

EXAMPLE 10

FIG. 24 is a schematic cross-sectional view of an inter-LSI-chip optical interconnection module on which the photodiode of the present invention is mounted. An optical signal sent from optical signal input fiber 46 is radiated onto photodiode 34 according to the present invention via concave mirror 48. In the case of a light wavelength of 850 nm, the semiconductor material of photodiode 34 is Si. In this case, the convex/concave pitch of the metal periodic structure is 600 to 700 nm. The photodiode made of Si further makes the optical near field created by the metal periodic structure optically couple with an MSM junction, generating a photocurrent and causing a current that corresponds to the optical signal in LSI 42 via photodiode wiring layer 44. Furthermore, by arranging a metal periodic structure that causes surface plasmon resonance, it is possible to ensure a positional coupling tolerance of ±1 μm or more between concave mirror 48 and photodiode 34.

Photodiode wiring layer 44 is electrically connected to "via holes for photodiode wiring 41" of LSI 42. Alternatively, well known methods other than an optical fiber, such as a planar optical waveguide, can be used to input an optical signal. Furthermore, light concentrating mechanism other than concave mirror 48, such as a convex lens, can also be used. Furthermore, a preamplifier for amplifying an electric signal may also be disposed immediately after photodiode 34 along the photodiode wiring layer.

The electric signal sent from LSI 42 is converted to an optical signal by VCSEL (Vertical Cavity Surface Emitting Laser) light source 39 provided with an electric modulation mechanism, via "light source and modulation electric signal via hole 40" and via "light source and modulation electric wiring layer 43". The optical signal is reflected by concave mirror 48 and sent to optical signal output fiber 45. VCSEL light source 39 provided with the electric modulation mechanism can be replaced by other known mechanisms that modulate light through electricity, such as, a Mach-Zehnder type modulator, which modulates light emitted from an external light source through an electro-optical effect or thermal optical effect.

A typical inter-LSI-chip interconnection for high-speed operation at 20 GHz or more uses an internally mounted photodiode made of a compound semiconductor material, such as InGaAs or the like, grown on an InP substrate in order to increase the response. A compound semiconductor is disadvantageous because it does not fit the manufacturing process of a Si semiconductor device and increases cost. On the contrary, the photodiode according to the present invention can reduce the manufacturing cost because it uses Si. Actually, the illustrated optical interconnection according to the present invention exhibited a high-speed photoelectric conversion operation at approximately 40 GHz.

The invention claimed is:

1. A photodiode comprising:
a semiconductor layer; and
a pair of metal electrodes which are arranged on a surface of the semiconductor layer at interval d, the pair of metal electrodes forming an MSM junction,
wherein the interval d satisfies a relationship λ>d >λ/100, where λ is a wavelength of incident light, and
wherein the pair of metal electrodes is capable of inducing surface plasmon, at least one electrode of the pair of electrodes forms a Schottky junction with the semiconductor layer, and a low end of the pair of metal electrodes is embedded into the semiconductor layer at a depth that is less than $\lambda/2n$, where n is a refractive index of the semiconductor layer, and wherein the metal electrodes are stacked on the semiconductor layer.

2. The photodiode according to claim 1, wherein one metal electrode of the pair of metal electrodes forms a Schottky barrier type junction with the semiconductor layer and the other metal electrode forms an ohmic junction with the semiconductor layer.

3. The photodiode according to claim 1, wherein the metal electrode comprises:

a first metal film that forms the Schottky junction with the semiconductor layer; and a second metal film stacked on the first metal film, the second metal film being capable of inducing surface plasmon.

4. The photodiode according to claim 1, further comprising a light confining structure which is provided remote from the surface of the pair of metal electrodes at a distance of $\lambda/2$ or less, wherein the light confining structure confines incident light within a micro region having an inner diameter of $\lambda$ or less or having an area of $10\,\mu m^2$ or less, the micro region being optically coupled with a region that is interposed between the pair of metal electrodes.

5. The photodiode according to claim 4, wherein the light confining structure comprises a conductive film that induces surface plasmon resonance, and wherein the conductive film comprises a micro opening that forms the micro region and a convex/concave structure, the convex/concave structure having concave parts and convex parts which are alternately and concentrically distributed about the micro opening.

6. The photodiode according to claim 5, wherein the conductive film is made up of aluminum, silver, gold or copper or an alloy made up of two or more of the elements aluminum, silver, gold and copper.

7. The photodiode according to claim 5, wherein the micro opening is provided with at least one metal projection that projects from a periphery of the micro opening into the micro opening.

8. The photodiode according to claim 7, wherein the metal projection comprises one or more pairs of metal projections that are opposite to each other.

9. The photodiode according to claim 7, wherein the metal projection is made up of aluminum, silver, gold or copper or an alloy made up of two or more of the elements aluminum, silver, gold and copper.

10. The photodiode according to claim 4, wherein a dielectric film which serves as a medium for optical coupling is inserted between the metal electrode and the light confining structure.

11. The photodiode according to claim 1, wherein the photodiode has a junction area of $100\,\mu m^2$ or less.

12. The photodiode according to claim 1, wherein the photodiode has a junction area of $10\,\mu m^2$ or less.

13. The photodiode according to claim 1, wherein the semiconductor layer has a thickness of $1\,\mu m$ or less.

14. The photodiode according to claim 1, wherein the semiconductor layer has a thickness of 200 nm or less.

15. The photodiode according to claim 1, wherein the semiconductor layer comprises at least one layer that is made of Si, $Si_xGe_{1-x}$, Ge, GaN, GaAs, GaInAs, GaInP or InP.

16. The photodiode according to claim 1, wherein the semiconductor layer comprises a layer that is made of $Si_xGe_{1-x}$ or Ge, and wherein an alloy layer that is made of Ni and Ge is formed in a junction area between each metal electrode and the semiconductor layer.

17. An optical communication device including the photodiode according to claim 1 in a light receiving section.

18. An optical communication device including the photodiode according to claim 1 in a light receiving section.

19. An optical interconnection module comprising:

a silicon substrate;

the photodiode according to claim 1 formed on the silicon substrate; and an LSI electronic circuit formed on the silicon substrate monolithically with the photodiode.

20. A photodiode comprising:

a semiconductor layer;

a pair of metal electrodes which are arranged at interval d on a surface of the semiconductor layer; and an opposite electrode that is provided in contact with a surface of the semiconductor layer that is opposite to the surface of the semiconductor layer, wherein the interval d satisfies a relationship $\lambda > d > \lambda/100$, where $\lambda$ is a wavelength of incident light, and wherein the pair of metal electrodes is capable of inducing surface plasmon, at least one electrode of the pair of electrodes forms a Schottky junction with the semiconductor layer, and a low end of the pair of metal electrodes is embedded into the semiconductor layer at a depth that is less than $\lambda/2n$, where n is a refractive index of the semiconductor layer, and wherein the metal electrodes are stacked on the semiconductor layer.

21. The photodiode according to claim 20, wherein the metal electrode comprises:

a first metal film that forms the Schottky junction with the semiconductor layer; and a second metal film stacked on the first metal film, the second metal film being capable of inducing surface plasmon.

22. The photodiode according to claim 21, wherein the second metal film is made up of aluminum, silver, gold or copper or an alloy made up of two or more of the elements aluminum, silver, gold and copper.

23. The photodiode according to claim 20, further comprising a light confining structure which is provided remote from the surface of the pair of metal electrodes at a distance of $\lambda/2$ or less, wherein the light confining structure confines incident light within a micro region having an inner diameter of $\lambda$ or less or having an area of $10\,\mu m^2$ or less, the micro region being optically coupled with a region that is interposed between the pair of metal electrodes.

24. The photodiode according to claim 23, wherein the light confining structure comprises a multilayered structure, which is made of two or more periodically arranged media having dielectric functions different from each other, or a photonic crystalline structure.

25. The photodiode according to claim 23, wherein the light confining structure comprises an optical waveguide that is made of a dielectric material, an organic compound or a semiconductor material.

26. The photodiode according to claim 25, wherein the optical waveguide comprises a ring-type resonator structure.

27. The photodiode according to claim 20 wherein the photodiode has a junction area of $100\,\mu m^2$ or less.

28. The photodiode according to claim 22, wherein the photodiode has a junction area of 100 µm² or less.

29. The photodiode according to claim 20, wherein the photodiode has a junction area of 10 µm² or less.

30. The photodiode according to claim 22, wherein the photodiode has a junction area of 10 µm² or less.

31. The photodiode according to claim 20, wherein the semiconductor layer has a thickness of 1 µm or less.

32. The photodiode according to claim 22, wherein the semiconductor layer has a thickness of 1 µm or less.

33. The photodiode according to claim 20, wherein the semiconductor layer has a thickness of 200 nm or less.

34. The photodiode according to claim 22, wherein the semiconductor layer has a thickness of 200 nm or less.

35. The photodiode according to claim 20, wherein the semiconductor layer comprises at least one layer that is made of Si, $Si_xGe_{1-x}$, Ge, GaN, GaAs, GaInAs, GaInP or InP.

36. The photodiode according to claim 22, wherein the semiconductor layer comprises at least one layer that is made of Si, $Si_xGe_{1-x}$, Ge, GaN, GaAs, GaInAs, GaInP or InP.

37. The photodiode according to claim 20, wherein the semiconductor layer comprises a layer that is made of $Si_xGe_{1-x}$ or Ge, and wherein an alloy layer that is made of Ni and Ge is formed in a junction area between each metal electrode and the semiconductor layer.

38. An optical communication device including the photodiode according to claim 20 in a light receiving section.

39. An optical interconnection module comprising:
a silicon substrate;
the photodiode according to claim 20 formed on the silicon substrate; and
an LSI electronic circuit formed on the silicon substrate monolithically with the photodiode.

40. An optical interconnection module comprising:
a silicon substrate;
the photodiode according to claim 22 formed on the silicon substrate; and
an LSI electronic circuit formed on the silicon substrate monolithically with the photodiode.

41. A photodiode comprising:
a semiconductor layer;
a pair of p electrode and n electrode which is arranged at an interval in the semiconductor layer, the pair of p electrode and n electrode forming a pin junction; and
a pair of metal films which is arranged at interval d on a surface of the semiconductor layer, stacked on the p electrode and the n electrode,
wherein the interval d satisfies a relationship $\lambda > d > \lambda/100$, where $\lambda$ is a wavelength of incident light, and
wherein the pair of metal electrodes is capable of inducing surface plasmon, at least one electrode of the pair of electrodes forms a Schottky junction with the semiconductor layer, and a low end of the pair of metal electrodes is embedded into the semiconductor layer at a depth that is less than $\lambda/2n$, where n is a refractive index of the semiconductor layer.

42. The photodiode according to claim 41, wherein the metal film is made up of aluminum, silver, gold or copper or an alloy made up of two or more of the elements aluminum, silver, gold and copper.

43. The photodiode according to claim 41, further comprising a light confining structure which is provided remote from the surface of the pair of metal films at a distance of $\lambda/2$ or less,
wherein the light confining structure confines incident light within a micro region having an inner diameter of $\lambda$ or less or having an area of 10 µm² or less, the micro region being optically coupled with a region that is interposed between the pair of metal films.

44. The photodiode according to claim 43, wherein a dielectric film which serves as a medium for optical coupling is inserted between the metal film and the light confining structure.

* * * * *